(12) United States Patent
Yamashita et al.

(10) Patent No.: US 11,974,432 B2
(45) Date of Patent: Apr. 30, 2024

(54) SEMICONDUCTOR STORAGE DEVICE AND METHOD FOR MANUFACTURING SEMICONDUCTOR STORAGE DEVICE

(71) Applicant: KIOXIA CORPORATION, Tokyo (JP)

(72) Inventors: Hiroyuki Yamashita, Yokkaichi Mie (JP); Yuta Saito, Yokkaichi Mie (JP); Keiichi Sawa, Yokkaichi Mie (JP); Kazuhiro Matsuo, Kuwana Mie (JP); Yuta Kamiya, Nagoya Aichi (JP); Shinji Mori, Nagoya Aichi (JP); Kota Takahashi, Yokkaichi Mie (JP); Junichi Kaneyama, Yokkaichi Mie (JP); Tomoki Ishimaru, Yokkaichi Mie (JP); Kenichiro Toratani, Yokkaichi Mie (JP); Ha Hoang, Kuwana Mie (JP); Shouji Honda, Kuwana Mie (JP); Takafumi Ochiai, Mie (JP)

(73) Assignee: Kioxia Corporation, Tokyo (JP)

( * ) Notice: Subject to any disclaimer, the term of this patent is extended or adjusted under 35 U.S.C. 154(b) by 126 days.

(21) Appl. No.: 17/412,743

(22) Filed: Aug. 26, 2021

(65) Prior Publication Data

US 2022/0302162 A1    Sep. 22, 2022

(30) Foreign Application Priority Data

Mar. 18, 2021 (JP) ................. 2021-044922

(51) Int. Cl.
*H10B 43/27* (2023.01)
*H01L 21/28* (2006.01)
(Continued)

(52) U.S. Cl.
CPC ........ *H10B 43/27* (2023.02); *H01L 29/40114* (2019.08); *H01L 29/40117* (2019.08);
(Continued)

(58) Field of Classification Search
None
See application file for complete search history.

(56) References Cited

U.S. PATENT DOCUMENTS 6,140,688 A * 10/2000 Gardner ................. H10B 41/42
257/E21.691
6,936,884 B2    8/2005 Chae et al.
(Continued)

FOREIGN PATENT DOCUMENTS

JP    2004134796 A    4/2004
JP    2004259986 A    9/2004
(Continued)

*Primary Examiner* — Xiaoming Liu
(74) *Attorney, Agent, or Firm* — Kim & Stewart LLP

(57) ABSTRACT

According to one embodiment, a semiconductor storage device includes a plurality of electrode films on a substrate, spaced from one another in a first direction. A charge storage film is provided on a side face the electrode films via a first insulating film. A semiconductor film is provided on a side face of the charge storage film via a second insulating film. The charge storage film includes a plurality of insulator regions contacting the first insulating film, a plurality of semiconductor or conductor regions provided between the insulator regions and another insulator region.

21 Claims, 14 Drawing Sheets

(51) Int. Cl.
  *H01L 29/423* (2006.01)
  *H10B 41/27* (2023.01)
(52) U.S. Cl.
  CPC .... *H01L 29/42324* (2013.01); *H01L 29/4234* (2013.01); *H10B 41/27* (2023.02)

(56) References Cited

U.S. PATENT DOCUMENTS

| | | | |
|---|---|---|---|
| 10,242,992 | B2 | 3/2019 | Sakamoto et al. |
| 10,763,272 | B2 | 9/2020 | Sakamoto et al. |
| 2004/0104426 | A1* | 6/2004 | Forbes ................. H01L 29/513 257/E21.209 |
| 2008/0164581 | A1* | 7/2008 | Cho ..................... H01L 29/518 257/632 |
| 2009/0256188 | A1* | 10/2009 | Sekine ................ H01L 21/3145 257/E21.267 |
| 2013/0248965 | A1 | 9/2013 | Nakai et al. |
| 2013/0264626 | A1 | 10/2013 | Sawa |
| 2016/0247908 | A1* | 8/2016 | Komiya ............ H01L 29/40114 |
| 2017/0263613 | A1* | 9/2017 | Murakoshi ............. H10B 43/20 |
| 2020/0075615 | A1 | 3/2020 | Oga et al. |
| 2020/0091165 | A1 | 3/2020 | Yamashita et al. |
| 2020/0091178 | A1 | 3/2020 | Nakao et al. |
| 2020/0295035 | A1 | 9/2020 | Sawa et al. |

FOREIGN PATENT DOCUMENTS

| | | |
|---|---|---|
| JP | 2013197546 A | 9/2013 |
| JP | 2013219239 A | 10/2013 |
| JP | 2017010951 A | 1/2017 |
| JP | 2020035977 A | 3/2020 |
| JP | 2020047620 A | 3/2020 |
| JP | 2020047744 A | 3/2020 |
| JP | 2020150227 A | 9/2020 |

* cited by examiner

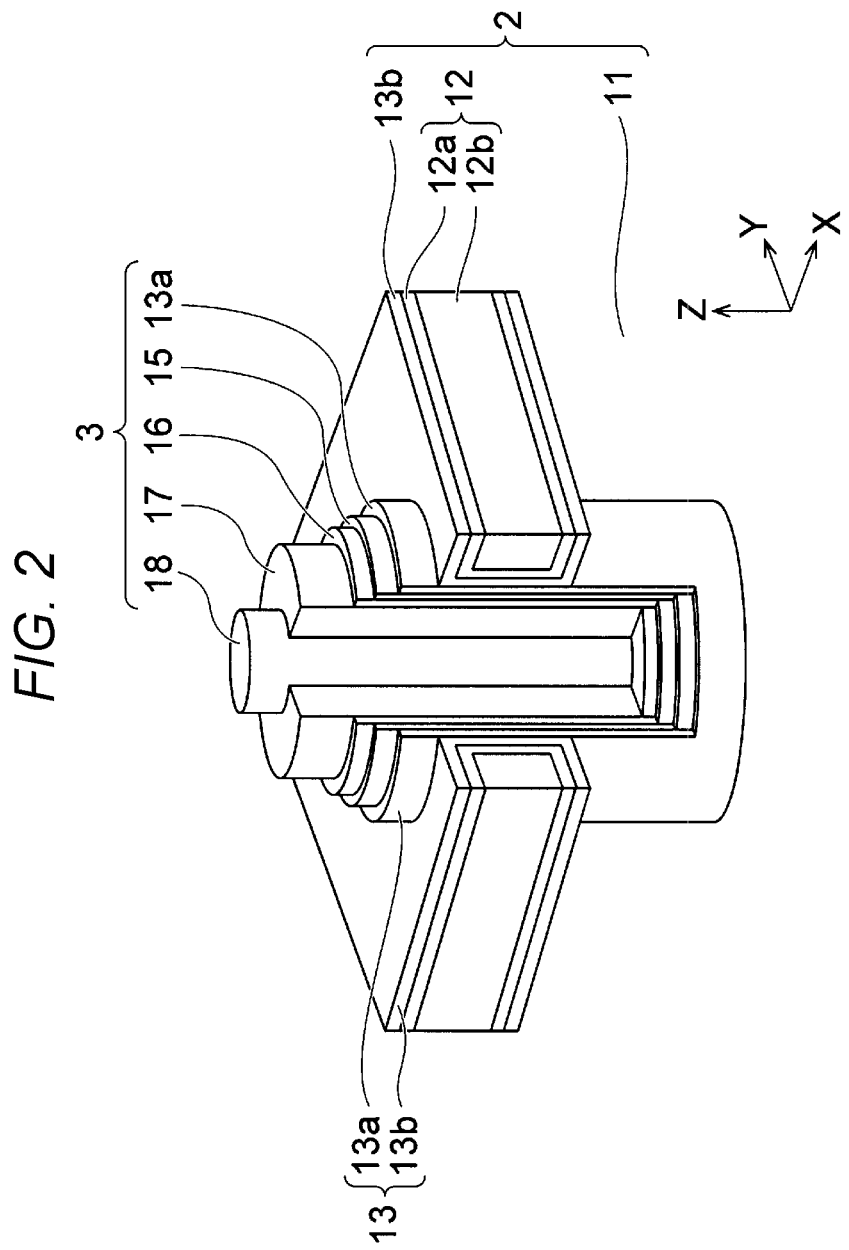

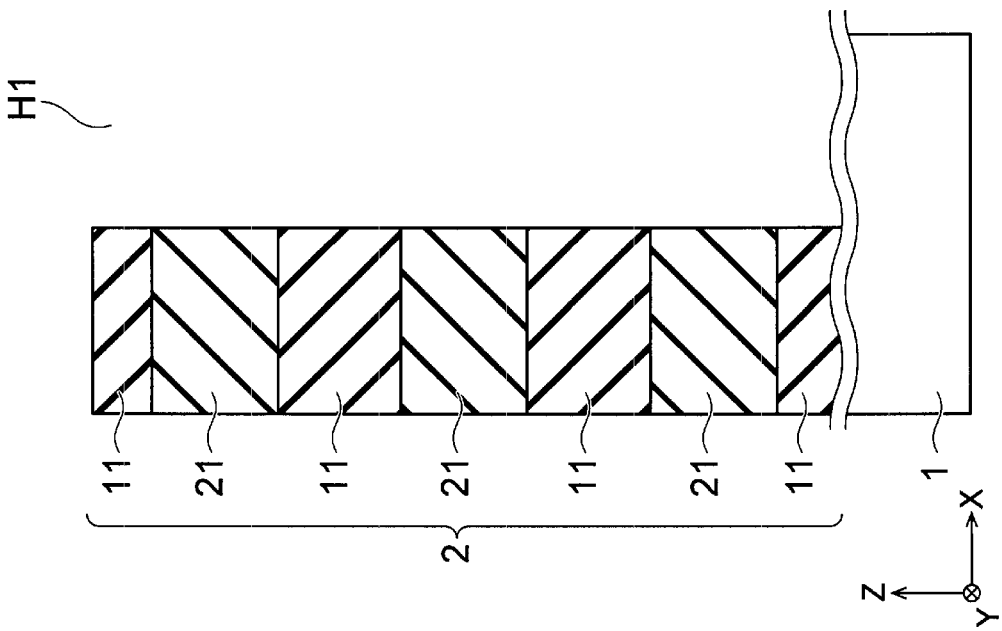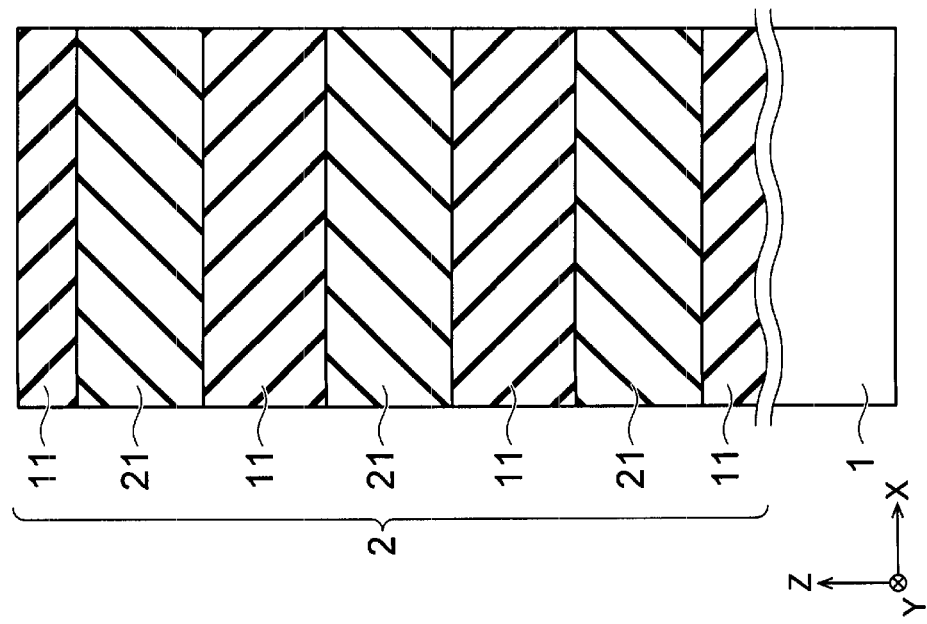

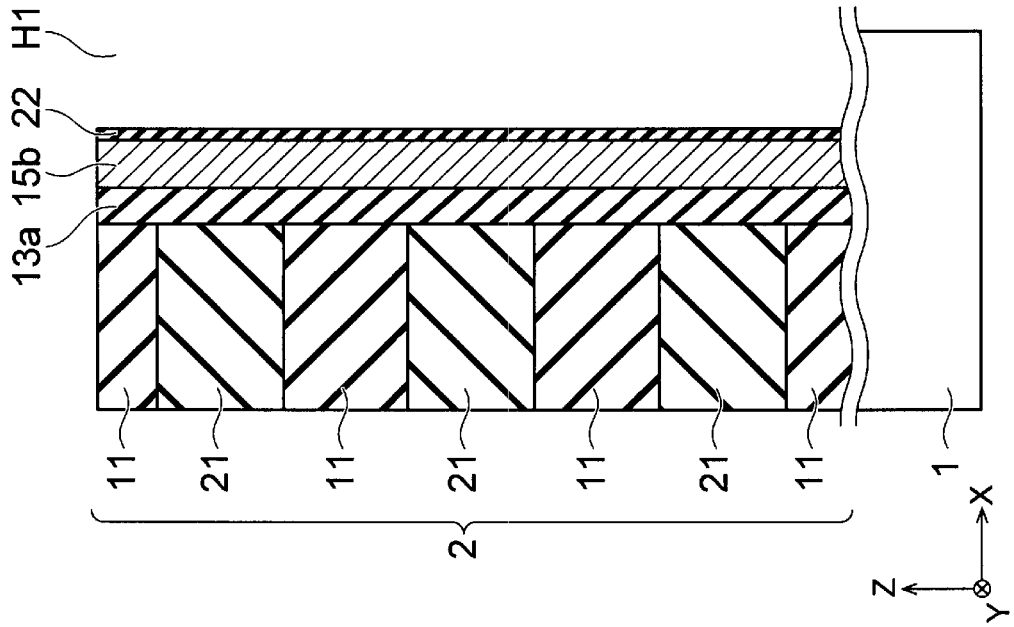
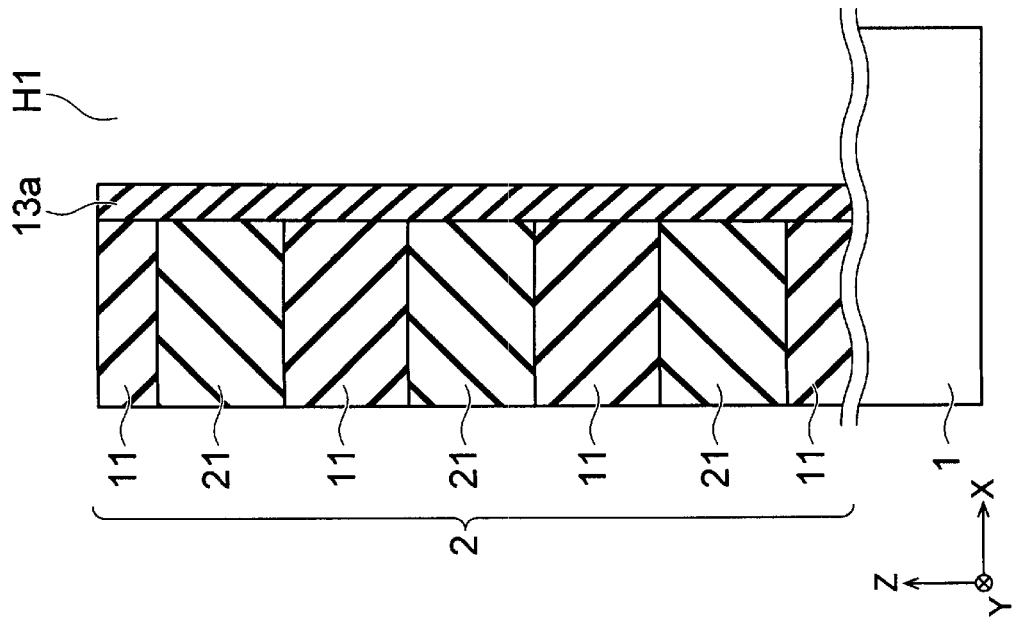

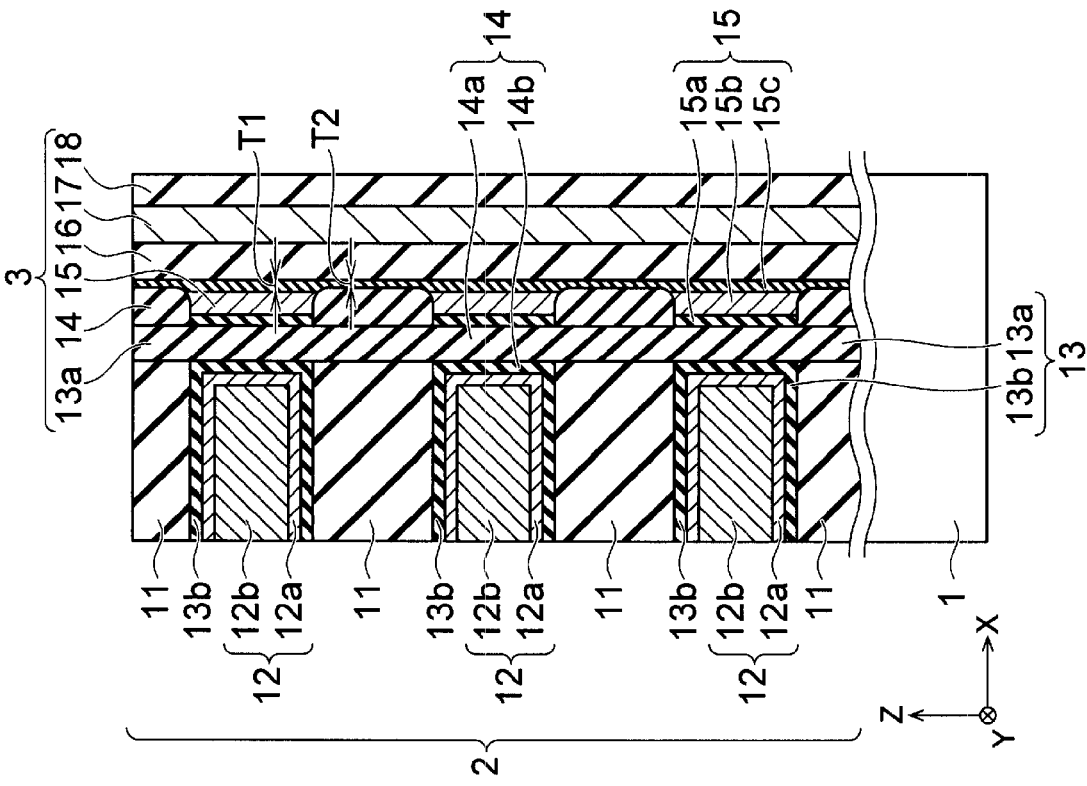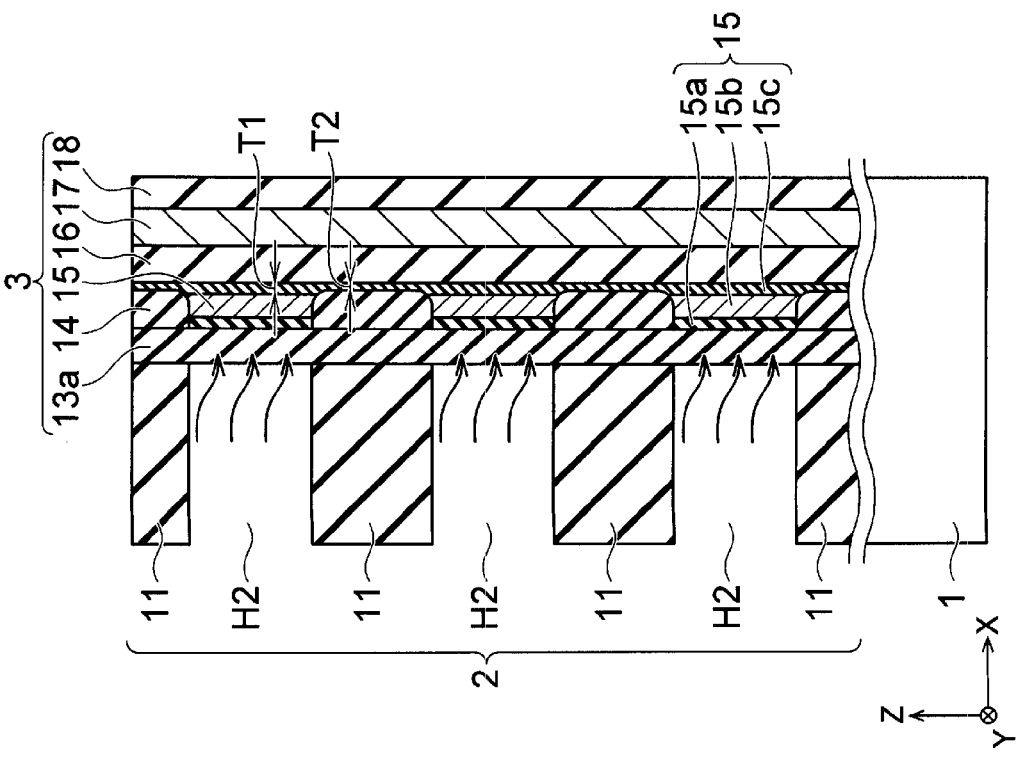

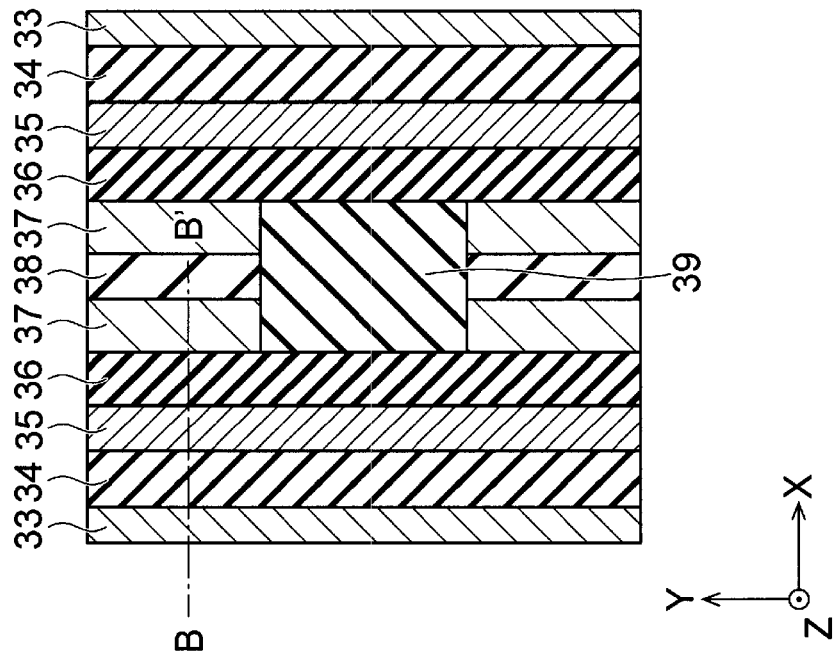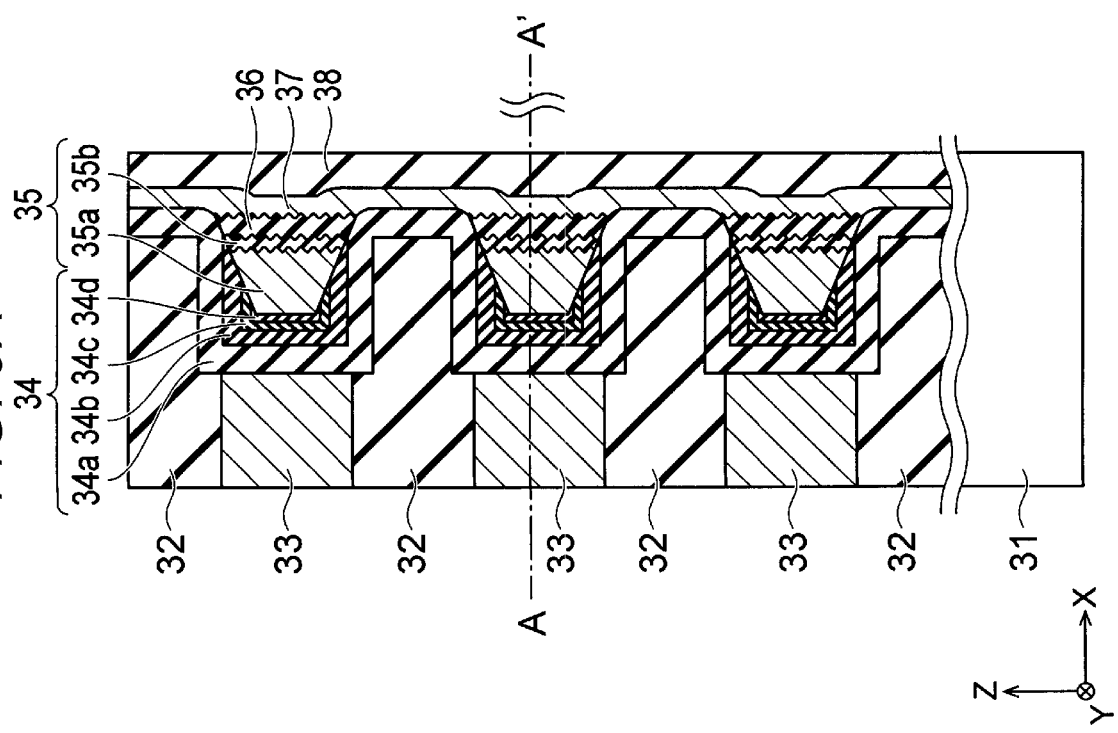

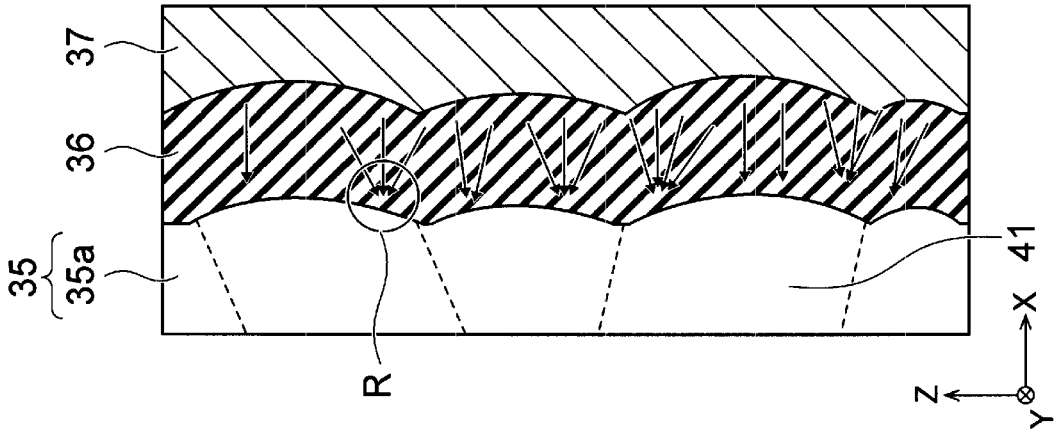
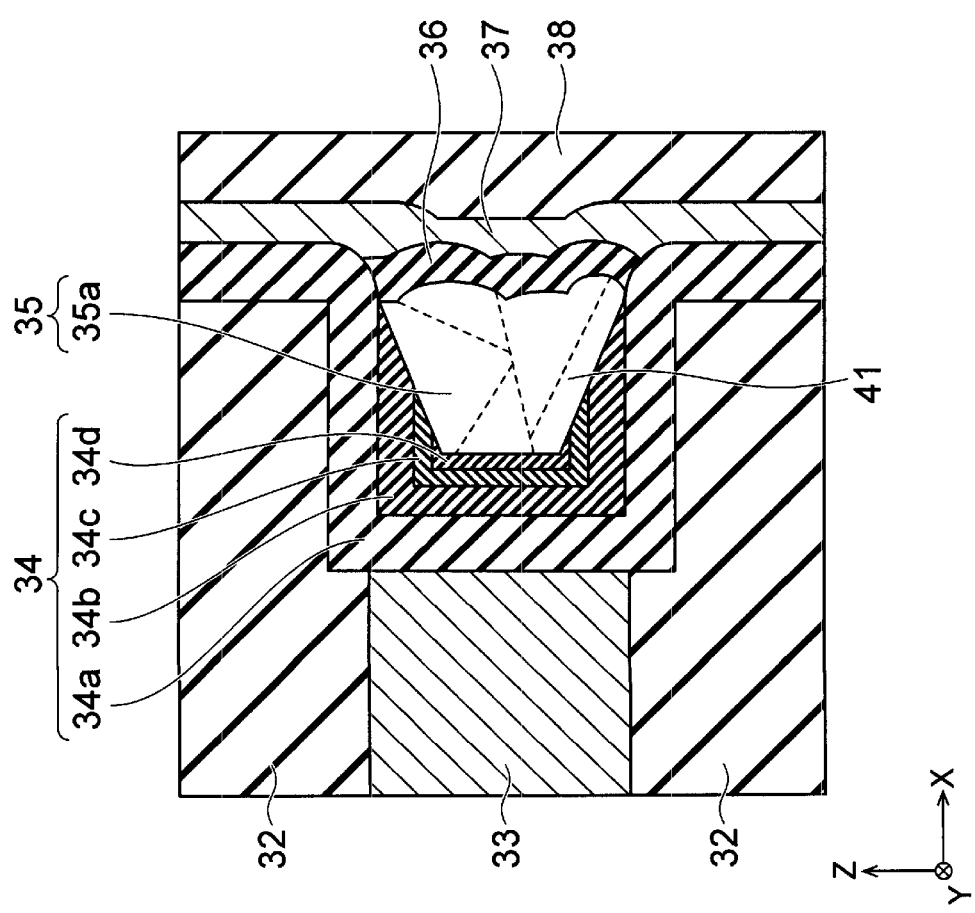

SEMICONDUCTOR STORAGE DEVICE AND METHOD FOR MANUFACTURING SEMICONDUCTOR STORAGE DEVICE

CROSS-REFERENCE TO RELATED APPLICATION

This application is based upon and claims the benefit of priority from Japanese Patent Application No. 2021-044922, filed Mar. 18, 2021, the entire contents of which are incorporated herein by reference.

FIELD

Embodiments described herein relate generally to semiconductor storage devices and methods for manufacturing semiconductor storage devices.

BACKGROUND

For a semiconductor storage device, such as a three-dimensional semiconductor memory, improvement in performance of a charge storage film in a memory cell is desired.

BRIEF DESCRIPTION OF THE DRAWINGS

FIG. 2 is a perspective view illustrating the structure of a semiconductor storage device according to a first embodiment.

FIGS. 4A and 4B are cross-sectional views illustrating aspects of a method for manufacturing a semiconductor storage device according to a first embodiment.

FIGS. 5A and 5B are cross-sectional views illustrating aspects of a method for manufacturing a semiconductor storage device according to a first embodiment.

FIGS. 8A and 8B are cross-sectional views illustrating aspects of a method for manufacturing a semiconductor storage device according to a first embodiment.

FIGS. 9A and 9B are cross-sectional views illustrating a structure of a semiconductor storage device according to a second embodiment.

FIGS. 10A and 10B are cross-sectional views illustrating a structure of a semiconductor storage device of a comparative example.

DETAILED DESCRIPTION

Figure 1:
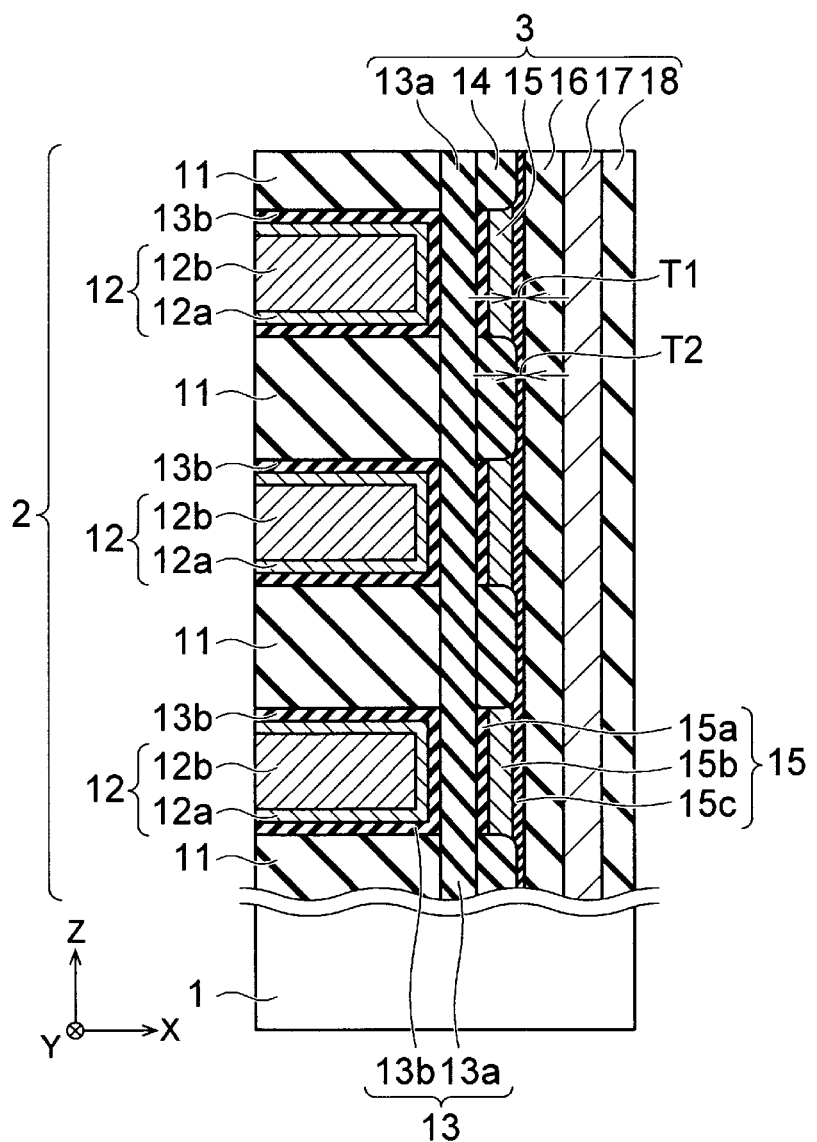
FIG. 1 is a cross-sectional view illustrating a structure of a semiconductor storage device according to a first embodiment.

In general, according to one embodiment, a semiconductor storage device includes a plurality of electrode films on a substrate. The electrode films are spaced from one another in a first direction orthogonal to a surface of the substrate. A first insulating film is formed on end portions of the electrode films. A charge storage film faces, via the first insulating film, the end portions of the electrode films in a second direction parallel to the surface of the substrate. A second insulating film is formed on the charge storage film. The charge storage film is between the first and second insulating films in the second direction. A semiconductor film is formed on the second insulating film. The second insulating film is between the charge storage film and the semiconductor film in the second direction. The charge storage film comprises a plurality of first regions that are spaced from each other in the first direction and made of an insulator material contacting the first insulating film, a plurality of second regions that are spaced from each other in the first direction and a semiconductive or conductive material directly adjacent to the first regions in the second direction, and a third region that is an insulator material adjacent to the second insulating film in the second direction.

Hereinafter, certain example embodiments will be described with reference to the drawings. In the drawings, the same elements are denoted with the same reference symbols, and duplicated description thereof may be omitted.

First Embodiment

FIG. 1 is a cross-sectional view illustrating a structure of a semiconductor storage device of a first embodiment. The semiconductor storage device in FIG. 1 is, for example, a three-dimensional semiconductor memory.

The semiconductor storage device in FIG. 1 includes a substrate 1, a stacked region 2, and a columnar region 3. The stacked region 2 and the columnar region 3 include a plurality of insulating films 11, a plurality of electrode films 12, a block insulating film 13, a plurality of intermediate insulating films 14, a charge storage film 15, a tunnel insulating film 16, a channel semiconductor film 17, and a core insulating film 18. Each of the electrode films 12 includes a barrier metal layer 12a and an electrode material layer 12b. The block insulating film 13 includes an insulating layer 13a and a plurality of insulating layers 13b. The charge storage film 15 includes a plurality of insulating layers 15a, a plurality of semiconductor layers 15b, and an insulating layer 15c. The block insulating film 13, the tunnel insulating film 16, and the intermediate insulating films 14 are examples of first, second, and third insulating films, respectively. The insulating layers 15a, the semiconductor layers 15b, and the insulating layer 15c are examples of first, second, and third regions, respectively.

For example, the substrate 1 is a semiconductor substrate such as a silicon substrate. In FIG. 1, X and Y directions are parallel to a surface of the substrate 1 and are perpendicular to each other, and a Z direction is orthogonal to the surface of the substrate 1. In this specification, a +Z direction is referred to as an upward direction or the like, and a −Z direction is referred to as a downward direction or the like. The −Z direction may be the same as or different from the direction of gravity.

The stacked region 2 includes a plurality of the insulating films 11, a plurality of the electrode films 12, and a plurality of the insulating layers 13b that are alternately formed above the substrate 1. For example, the insulating films 11 are each a silicon oxide film ($SiO_2$ film). For example, the electrode films 12 each include a barrier metal layer 12a such as a titanium nitride film (TiN film), and an electrode material layer 12b such as a tungsten (W) layer. The barrier metal layer 12a and the electrode material layer 12b in each of the electrode films 12 are formed on upper and lower faces of each of the insulating films 11, and a side face of the columnar region 3 via each of the insulating layers 13b. For example, the insulating layers 13b are an aluminum oxide film ($AlO_x$ film). In this embodiment, a plurality of the electrode films 12 are separated from one another in the Z direction, and a plurality of the insulating films 11 are disposed between the electrode films 12.

The columnar region 3 has a columnar shape extending in the Z direction through the stacked region 2. The columnar region 3 includes the insulating layer 13a, the intermediate insulating films 14, the charge storage film 15, the tunnel insulating film 16, the channel semiconductor film 17, and the core insulating film 18 that are formed in order on a side face (sidewall) of the stacked region 2. The semiconductor storage device of the present embodiment includes a plurality of the columnar region 3 in the stacked region 2. In FIG. 1, just one of these columnar regions 3 is illustrated.

The insulating layer 13a is formed on side faces of the insulating films 11 and on side faces of the electrode films 12 via of the insulating layers 13b. For example, the insulating layer 13a is a $SiO_2$ film.

The intermediate insulating films 14 are formed on the side faces of the insulating films 11 via the insulating layer 13a. For example, the intermediate insulating films 14 are a $SiO_2$ film.

The charge storage film 15 is formed on side faces of the insulating layer 13a and the intermediate insulating films 14. The charge storage film 15 is used to store a signal charge of a memory cell transistor. The charge storage film 15 of the present embodiment includes a plurality of the insulating layers 15a that are discrete portions formed at positions facing end portions of the electrode films 12. The charge storage film 15 also includes plurality of the semiconductor layers 15b that are discrete portions formed on a side of the insulating layers 15a. The charge storage film further includes an insulating layer 15c that is formed on a side of the semiconductor layers 15b. The intermediate insulating films 14 are formed between the insulating layers 15a adjacent to one another in the Z direction and also between the semiconductor layers 15b adjacent to one another in the Z direction. The intermediate insulating films 14 are each in contact with the side face (sidewall) of the insulating layer 15c. The charge storage film 15 faces an end portion of each of the electrode films 12 via the block insulating film 13.

The insulating layers 15a and the semiconductor layers 15b are each formed at a position corresponding to each of the electrode films 12 in the Z direction. The intermediate insulating films 14 are each formed at a position corresponding to each of the insulating films 11 in the Z direction. The insulating layer 15c is formed at a position corresponding to both the insulating films 11 and the electrode films 12 in the Z direction. The position in the Z direction of an upper or lower end of each of the insulating layers 15a and the semiconductor layers 15b need not completely match or overlap with the position in the Z direction of an upper or lower face of each of the electrode films 12. The insulating layers 15a and the semiconductor layers 15b may just partially overlap the positions in the Z direction of the electrode films 12 in some examples. Likewise, the positions in the Z direction of an upper or lower ends of each of the intermediate insulating films 14 need not completely match or overlap with the position in the Z direction of the upper or lower face of each of the insulating films 11. In some examples, the intermediate insulating films 14 may just partially overlap the positions in the Z direction of the insulating films 11.

In the present example, the insulating layers 15a are a silicon nitride film (SiN film). The insulating layers 15a may function as a charge trapping layer in the charge storage film 15 to store a charge. The composition ratio of nitrogen (N) atoms to silicon (Si) atoms in the insulating layers 15a is, for example, 1.22 or more (N/Si≥1.22). For example, the composition ratio can be analyzed by electron energy loss spectroscopy (EELS), X-ray photo electron spectroscopy (XPS), or Rutherford backscattering spectrometry (RBS). For example, the insulating layers 15a and the intermediate insulating films 14 of the embodiment are SiN and $SiO_2$, respectively. The dielectric constant of the intermediate insulating films 14 is lower than the dielectric constant of the insulating layers 15a.

For example, the semiconductor layers 15b are a polysilicon layer. The semiconductor layers 15b may function as a floating gate layer in the charge storage film 15 to store a charge. The semiconductor layers 15b may contain a boron (B) or phosphorus (P) element dopant (impurity). In this case, the atomic concentration of a B or P dopant in the semiconductor layers 15b is desirably in a range of $1.0 \times 10^{19}$ atoms/$cm^3$ to $5.0 \times 10^{20}$ atoms/$cm^3$. The semiconductor layers 15b of the first embodiment are disposed between the insulating layers 15a and the insulating layer 15c, and therefore the semiconductor layers 15b do not contact the insulating layer 13a or the tunnel insulating film 16. In some examples, the charge storage film 15 may contain a conductor layer (e.g., a metal layer) instead of the semiconductor layers 15b. In the present example, the composition ratio of N atoms to Si atoms in the semiconductor layers 15b is less than the composition ratio of N atoms to Si atoms in the insulating layers 15a or the insulating layer 15c. For example, the composition ratio can be analyzed by EELS, XPS, or RBS.

For example, the insulating layer 15c is a SiN film. The insulating layer 15c may function as a charge trapping layer in the charge storage film 15 to store a charge. The composition ratio of N atoms to Si atoms in the insulating layer 15c is, for example, 1.22 or more (N/Si≥1.22). For example, the composition ratio can be analyzed by EELS, XPS, or RBS. For example, the insulating layer 15c and the intermediate insulating films 14 are SiN and $SiO_2$, respectively. The dielectric constant of the intermediate insulating films 14 is lower than the dielectric constant of the insulating layer 15c.

In FIG. 1, a thickness T1 of the insulating layer 15c between the semiconductor layers 15b and the tunnel insulating film 16 and a thickness T2 of the insulating layer 15c between the intermediate insulating films 14 and the tunnel insulating film 16 are illustrated. In the embodiment, the thickness T2 is less than the thickness T1 (T2<T1).

The tunnel insulating film 16 is formed on a side face of the charge storage film 15. For example, the tunnel insulating film 16 is a silicon oxynitride film (SiON film).

The channel semiconductor film 17 is formed on a side face of the tunnel insulating film 16. The channel semiconductor film 17 functions as a channel of a memory cell transistor or a select transistor. For example, the channel semiconductor film 17 is a polysilicon layer. The channel semiconductor film 17 is formed on the side face of the charge storage film 15 via the tunnel insulating film 16.

The core insulating film 18 is formed on a side face of the channel semiconductor film 17. For example, the core insulating film 18 is a $SiO_2$ film.

As illustrated in FIG. 1, the block insulating film 13, the intermediate insulating films 14, the charge storage film 15, the tunnel insulating film 16, the channel semiconductor film 17, and the core insulating film 18 include regions positioned to face the electrode films 12, and regions positioned to face the insulating films 11. Memory cells (memory cell transistors) of the semiconductor storage device of the present embodiment are formed in the regions facing the electrode films 12. These regions are called cell units. On the other hand, each region between the cell units adjacent to each other is called inter-cell unit. The block insulating film 13, the intermediate insulating films 14, the charge storage film 15, the tunnel insulating film 16, the channel semiconductor film 17, and the core insulating film 18 include portions forming the cell units on the side of the electrode films 12 and the inter-cell units on the side of the insulating films 11.

FIG. 2 is a perspective view illustrating the structure of the semiconductor storage device of the first embodiment.

FIG. 2 illustrates one of the electrode films 12 contained in the stacked region 2 and a portion of the columnar region 3 that penetrates this electrode film 12. The planar shape of the columnar region 3 is circular as illustrated in FIG. 2. The core insulating film 18 is disposed at the central part of the columnar region 3, and is encircled in the XY plane along its length in the Z direction by the channel semiconductor film 17, the tunnel insulating film 16, the charge storage film 15, and the insulating layer 13a. In FIG. 2, depiction of the intermediate insulating films 14 is omitted.

Figure 3B:
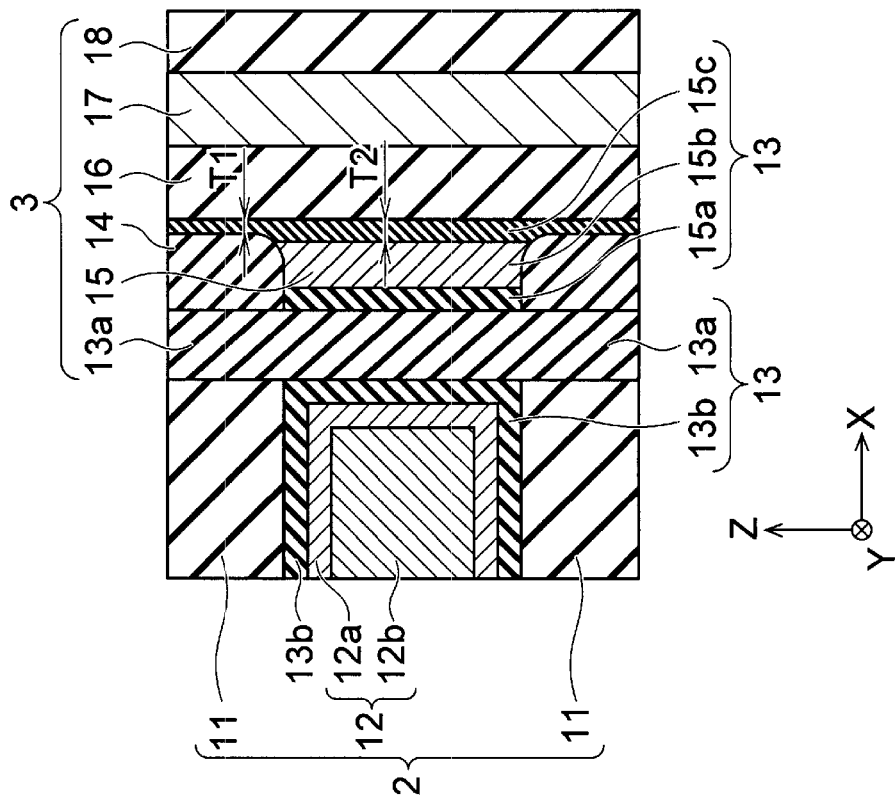
FIG. 3B is a cross-sectional view illustrating the structure of a semiconductor storage device according to a first embodiment.
Figure 3A:
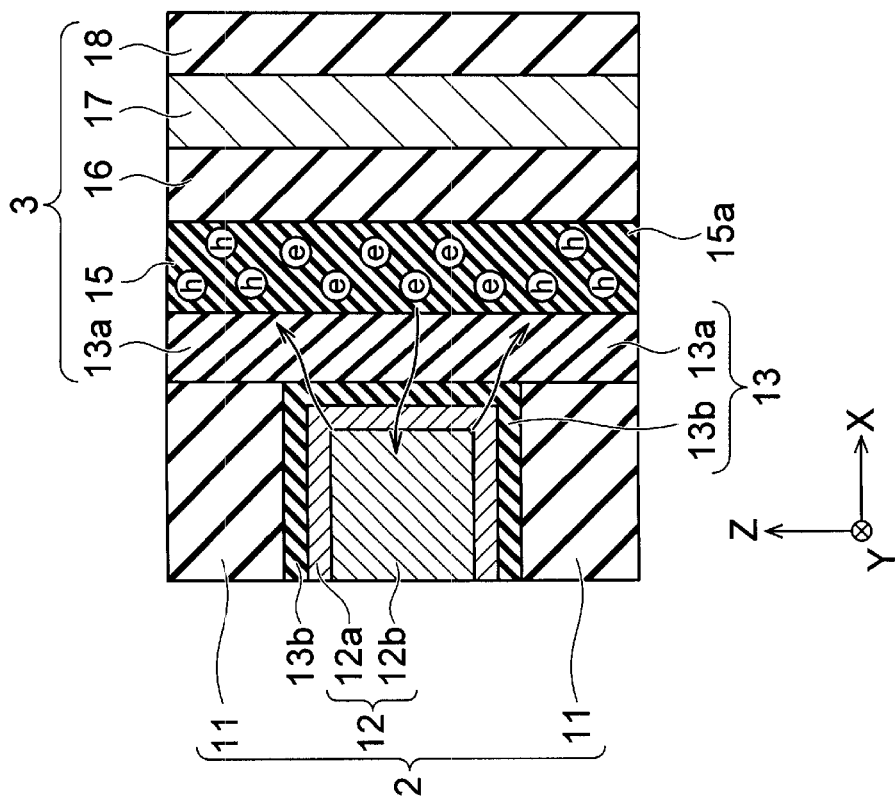
FIG. 3A is a cross-sectional view illustrating a structure of a semiconductor storage device of a comparative example.

FIG. 3A is a cross-sectional view illustrating a structure of a semiconductor storage device of a first comparative example, and FIG. 3B is a cross-sectional view illustrating the structure of the semiconductor storage device of the first embodiment.

FIG. 3A illustrates the structure of the semiconductor storage device of first comparative example. A charge storage film 15 of first comparative example includes only an insulating layer 15a that functions as a charge trapping layer. In this first comparative example, when the insulating layer 15a is a SiN film that is rich in silicon (Si) to decrease remaining holes, a leak current at a block insulating film 13 may increase, and write properties to memory cells may be deteriorated. Particularly, charge holding properties of the charge storage film 15 may be deteriorated after application of cycle stress. Furthermore, transverse leakage of charge from the memory cells may increase, or the threshold value distribution of memory cell transistors may increase.

FIG. 3B illustrates the structure of the semiconductor storage device of the first embodiment. The charge storage film 15 of the first embodiment includes the semiconductor layers 15b that function as a floating gate layer between the insulating layers 15a and 15c that function as a charge trapping layer. Therefore, the charge storage film 15 of the first embodiment includes the semiconductor layers 15b that have a high trap density at a central part thereof, and the insulating layers 15a and 15c that have high charge holding properties outside the central part. The charge storage film 15 of the first embodiment can thus be said to have a hybrid structure including both a floating gate layer and a charge trapping layer. Furthermore, the charge storage film 15 of the first embodiment includes the insulating layers 15a and the semiconductor layers 15b that are divided from each other by cell unit.

According to the first embodiment, it is possible to suppress a leak current at the block insulating film 13, and to suppress deterioration of charge holding properties of the charge storage film 15 after the application of cycle stresses. According to the first embodiment, it is possible to improve the cell properties and reliability of the memory cells by inclusion of the semiconductor layers 15b. Therefore, these effects can be achieved by using a charge storage film 15 having a hybrid structure according to the first embodiment.

In general, a floating gate layer has an advantage in which the write properties are favorable due to high trap density, but has a disadvantage that a leak current (referred to as a stress induce leak current (SILC)) is generated by repeating writing and erasing. In the first embodiment, the charge storage film 15 includes the semiconductor layers 15b. Therefore, the aforementioned advantage can be obtained. Additionally, the charge storage film 15 of the first embodiment further includes the insulating layers 15a and 15c. Therefore, the aforementioned disadvantage can be reduced. In general, this is considered to be because the semiconductor layers 15b are do not directly contact the block insulating film 13 and the tunnel insulating film 16, and therefore a charge can be trapped at a trap level of the semiconductor layers 15b even after application of cycle stress. In the first embodiment, the charge storage film 15 includes the semiconductor layers 15b and the insulating layers 15a and 15c. Therefore, the capacitance of charge capable of being held can be increased as compared with a case where the charge storage film 15 includes only the insulating layers 15a and 15c.

In the first embodiment, the insulating layers 15a and the semiconductor layers 15b are divided into cell units. Therefore, it is possible to decrease remaining holes, and to decrease transverse leakage of charge from the memory cells. In this case, when the dielectric constant of the intermediate insulating films 14 is decreased, interference between the memory cells can be suppressed.

In the first embodiment, a boron (B) or phosphorous (P) dopant can be added to the semiconductor layers 15b. Thus, the trap density can be made higher than otherwise. In this case, the atomic concentration of the B or P element in the semiconductor layers 15b is desirably between $1.0 \times 10^{19}$ atoms/$cm^3$ and $5.0 \times 10^{20}$ atoms/$cm^3$.

In the first embodiment, the insulating layers 13b may be nitrided, and an interface between the insulating layers 13b and the insulating films 11 may be nitrided, to form a fluorine-degassed barrier layer. Thus, occurrence of damage to the block insulating film 13 by fluorine (F) atoms generated during formation of the electrode material layers 12b can be suppressed. In this case, the insulating layers 13b and the interface contain nitrogen (N) atoms.

FIG. 4A to 8B are cross-sectional views illustrating a method for manufacturing a semiconductor storage device according the first embodiment.

On the substrate 1, a plurality of insulating films 11 and a plurality of sacrificial films 21 are alternately formed (FIG. 4A). For example, the insulating films 11 are a $SiO_2$ film having a thickness of about 30 nm. The insulating films 11 are formed by plasma chemical vapor deposition (CVD) using $SiH_4$ and $N_2O$ gases as precursors. At the positions of the sacrificial films 21, the electrode films 12 are ultimately formed in a replacement process described below. For example, the sacrificial films 21 are a SiN film having a thickness of about 30 nm. The sacrificial films 21 are formed by plasma CVD using $SiH_2Cl_2$ and $NH_3$ gases as precursors.

Subsequently, a memory hole H1 is formed in the insulating films 11 and the sacrificial films 21 by lithography and reaction ion etching (RIE) (FIG. 4B). The memory hole H1 is processed in a column or pillar shape extending in the Z direction. Within the memory hole H1, the columnar region 3 is formed in a process described below. Into the memory hole H1, hot phosphoric acid is supplied to selectively etch sacrificial films 21. Thus, side faces of the sacrificial films 21 can be recessed relative to side faces of the insulating films 11.

Next, the insulating layer 13a is formed in the memory hole H1 (FIG. 5A). As a result, the insulating layer 13a is formed on the side faces of the insulating films 11 and the sacrificial films 21. For example, the insulating layer 13a is a $SiO_2$ film. The insulating layer 13a is formed by atomic layer deposition (ALD) using a tris(dimethylamino)silane gas as a precursor. In some examples, the insulating layer 13a may be formed on the side faces of the sacrificial films 21 by directly oxidizing the side faces of the sacrificial films 21 under radical oxidation.

Next, the semiconductor layer 15b is formed in the memory hole H1 (FIG. 5B). As a result, the semiconductor layer 15b is formed on a side face of the insulating layer 13a. For example, the semiconductor layer 15b is a silicon layer having a thickness of about 10 nm. The semiconductor layer 15b is formed in a reduced pressure environment (e.g., 2,000 Pa or less) at 515° C. by CVD using $Si_2H_6$ and $SiH_4$ gases as precursors. The resulting layer is then crystallized by annealing. As a result, this silicon layer is changed from an amorphous silicon layer to a polysilicon layer. At this time, a B or P dopant may be added to the semiconductor layer 15b by using a $B_2H_6$ or $PH_3$ gas. FIG. 5B further illustrates a natural (native) oxidation film 22 that is formed on a side face of the semiconductor layer 15b after formation of the semiconductor layer 15b.

Figure 6B:
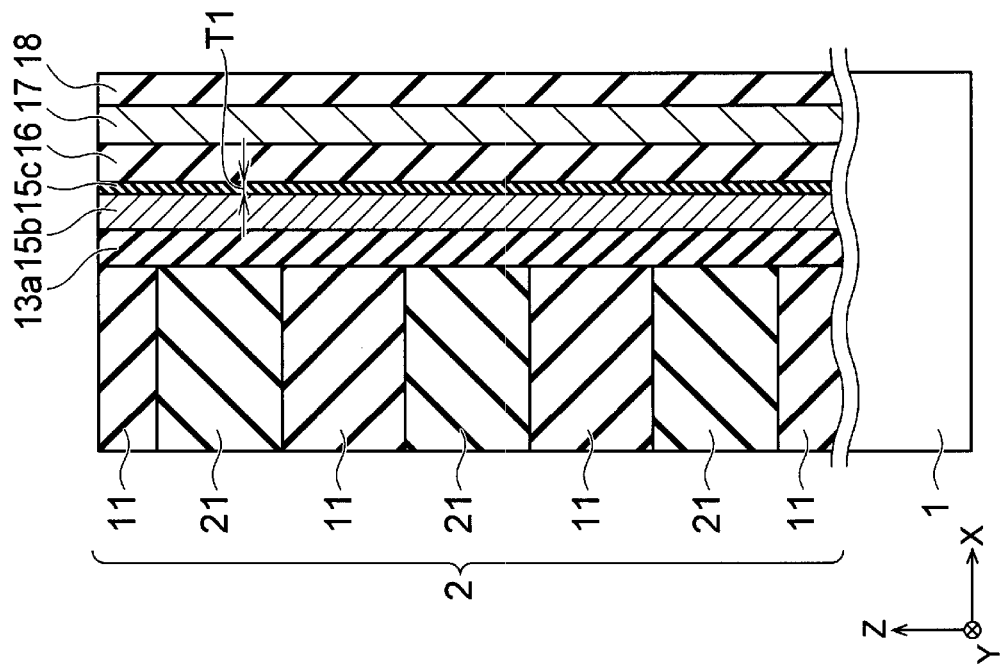
FIGS. 6A and 6B are cross-sectional views illustrating aspects of a method for manufacturing a semiconductor storage device according to a first embodiment.
Figure 6A:
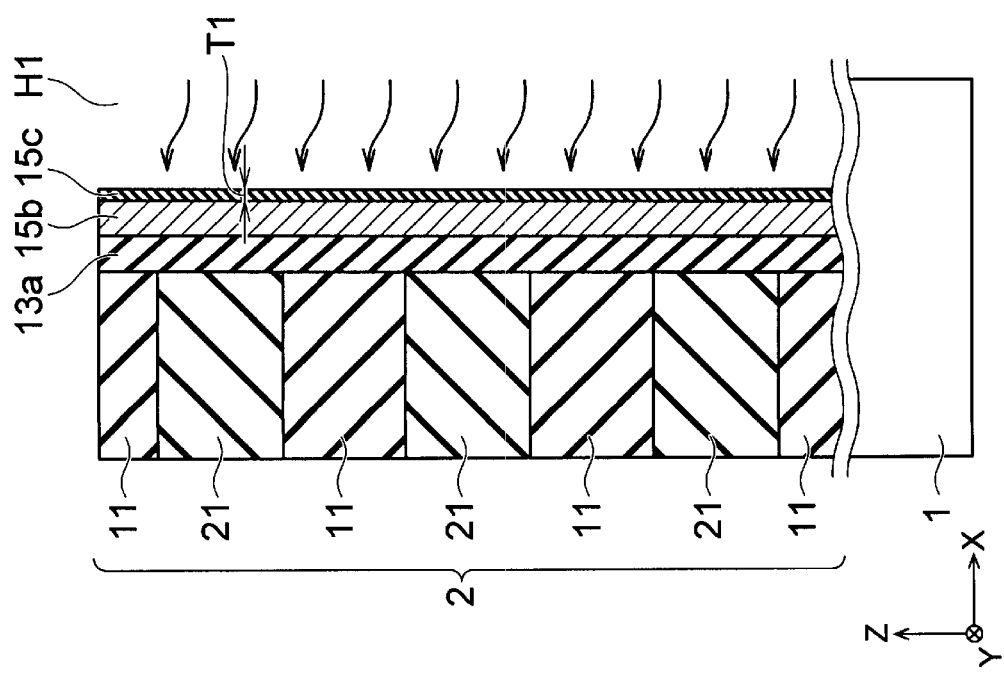

Next, the side face of the semiconductor layer 15b is nitrided (FIG. 6A). As a result, the insulating layer 15c is formed on the side face of the semiconductor layer 15b on a side opposite to the insulating layer 13a. For example, the insulating layer 15c is a SiN film. The insulating layer 15c is formed by thermal nitridation in an atmosphere of a $NH_3$, nitric oxide (NO), or nitrous oxide ($N_2O$) gas between 650° C. and 950° C., at 9,000 Pa. In other examples, the insulating layer 15c may be formed by radical nitridation in an atmosphere of a $N_2$, $NH_3$, NO, or $N_2O$ gas at 300° C. to 800° C., at 5 Pa to 250 Pa. In this case, the atmosphere may also contain helium (He), neon (Ne), argon (Ar), krypton (Kr), xenon (Xe), or radon (Rn) gas. The insulating layer 15c may be formed after removal of the oxidation film 22 or without removal of the oxidation film 22. In the latter case, the natural oxidation film 22 will also be changed into a portion of the insulating layer 15c. In the process of FIG. 6A, the insulating layer 15c is formed so as to have a thickness T1.

Subsequently, the tunnel insulating film 16, the channel semiconductor film 17, and the core insulating film 18 are formed in this order inside the memory hole H1 (FIG. 6B). For example, the tunnel insulating film 16 is a SiON film having a thickness of about 7 nm. The tunnel insulating film 16 is formed by ALD in a reduced pressure environment (2,000 Pa or less) at 400° C. to 800° C. using hexachlorodisilane ("HCD"), $O_2$, and $NH_3$ gases. For example, the channel semiconductor film 17 is a silicon (Si) layer having a thickness of about 10 nm. The channel semiconductor film 17 is formed by CVD in a reduced pressure environment (2,000 Pa or less) at 400° C. to 800° C. using a $SiH_4$ gas. The channel semiconductor film 17 is then crystalized by annealing. As a result, this deposited silicon layer is changed from an amorphous silicon layer to a polysilicon layer. For example, the core insulating film 18 is a $SiO_2$ film. The core insulating film 18 is formed by CVD using tetraethyl orthosilicate ("TEOS") as a precursor.

In some examples, the insulating layer 15c may be formed by forming the tunnel insulating film 16 on the side face of the semiconductor layer 15b and then nitriding the side face of the semiconductor layer 15b through the tunnel insulating film 16. In this case, the insulating layer 15c is formed, for example, by thermal nitridation in an atmosphere of a NO or $N_2O$ gas at 800° C. to 950° C. and 9,000 Pa, or by radical nitridation at 300° C. to 800° C. and 5 Pa to 250 Pa. The atmosphere may also contain He, Ne, Ar, Kr, Xe, or Rn gas.

After formation of an amorphous silicon layer as the channel semiconductor film 17 on the side face of the semiconductor layer 15b, the insulating layer 15c and the tunnel insulating film 16 may be formed by oxidizing and nitriding the side face of the semiconductor layer 15b through the amorphous silicon layer before its change from the amorphous silicon layer to a polysilicon layer. In this case, the insulating layer, for example, the $SiO_2$ film is first formed by oxidation via the amorphous silicon layer. For example, this insulating layer is formed by thermal oxidation in an atmosphere of a $H_2O$ gas at 650° C. to 950° C. and 9,000 Pa, or by radical oxidation in an atmosphere of $H_2$ and $O_2$ gases (or alternatively an atmosphere of a $H_2O$ gas) at 300° C. 800° C. and 5 Pa to 250 Pa. After then, the insulating layer 15c and the tunnel insulating film 16 are formed by thermal nitridation in an atmosphere of a NO or $N_2O$ gas at 800° C. to 950° C. and 9,000 Pa. In some examples, the insulating layer 15c and the tunnel insulating film 16 may be formed by radical nitridation in an atmosphere of a NO or $N_2O$ gas at 300° C. to 800° C. and 5 Pa to 250 Pa. In this case, the atmosphere may contain He, Ne, Ar, Kr, Xe, or Rn gas.

Figure 7B:
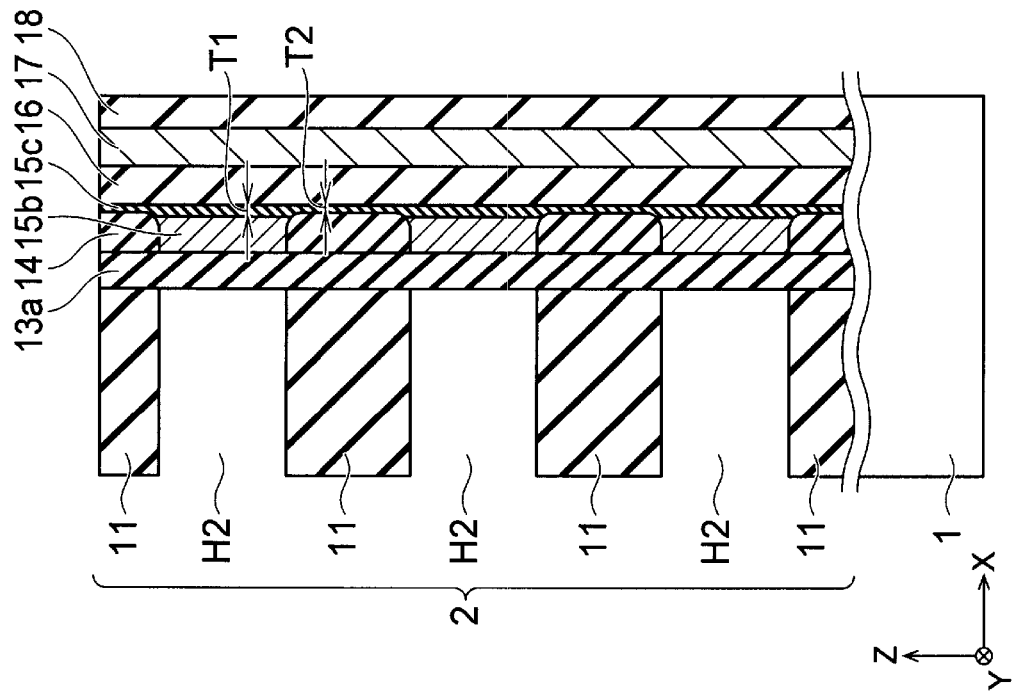
FIGS. 7A and 7B are cross-sectional views illustrating aspects of a method for manufacturing a semiconductor storage device according to a first embodiment.
Figure 7A:
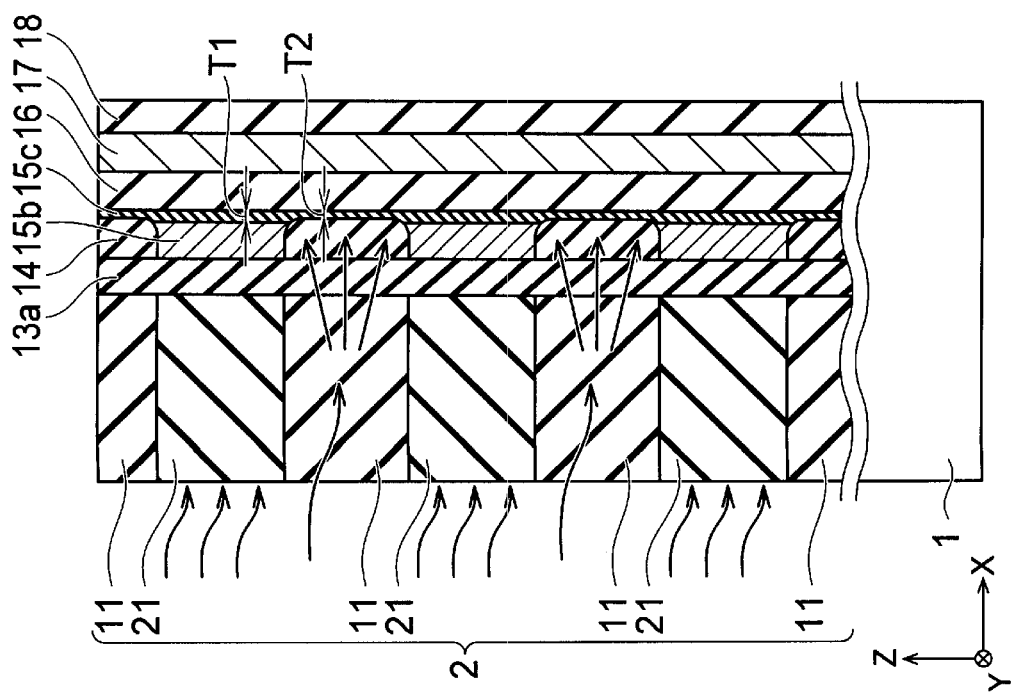

Next, a slit is formed in the insulating films 11 and the sacrificial films 21, and then the process shown in FIG. 7A is performed. In the process shown in FIG. 7A, the side face of the semiconductor layer 15b is oxidized through the slit and the insulating films 11 and the insulating layer 13a. As a result, a plurality of the intermediate insulating films 14 are formed from apart of the semiconductor layer 15b. In the semiconductor layer 15b, the intermediate insulating films 14 are formed at regions generally between the insulating films 11 and the insulating film 15c. At regions between the sacrificial layers 21 and the insulating layer 15c, the semiconductor layer 15b is maintained substantially unaltered. The positions in the Z direction of regions where the intermediate insulating films 14 are formed may match with the positions of the insulating layers 11, or may be shifted somewhat upwardly or downwardly. For example, the intermediate insulating films 14 area $SiO_2$ film. The intermediate insulating films 14 are formed by thermal oxidation in an atmosphere of a $H_2O$ gas at 950° C. and 9,000 Pa. The intermediate insulating films 14 may be formed by radical oxidation at 300° C. to 800° C. and 5 Pa to 250 Pa.

The intermediate insulating films 14 are formed by oxidizing the semiconductor layer 15b via the insulating films 11. That is, an oxidizing gas passes (diffuses) through the insulating films 11 from the previously formed slit or the like to reach portions of the semiconductor layer 15b. At least one part of each of the intermediate insulating films 14 is formed so as to reach all the way to the insulating layer 15c. Therefore, the previous unitary semiconductor layer 15b is divided into a plurality of separated semiconductor layers 15b by the formation of the intermediate insulating films 14.

In FIG. 7A, the intermediate insulating films 14 are formed between the semiconductor layers 15b adjacent to one another. At least one part of the intermediate insulating films 14 is formed so as to reach the insulating layer 15c. Therefore, the thickness T2 is less than the thickness T1 (T2<T1). The thickness of at least one part of the insulating layer 15c between the intermediate insulating films 14 and the tunnel insulating film 16 may be less than the thickness of the insulating layer 15c between the semiconductor layers 15b and the tunnel insulating film 16. As described above, the reference symbol T1 represents the thickness of the insulating layer 15c between the semiconductor layers 15b and the tunnel insulating film 16, and the reference symbol T2 represents the thickness of the insulating layer 15c between the intermediate insulating films 14 and the tunnel insulating film 16.

Next, the sacrificial films 21 are removed (FIG. 7B) via the previously formed slit. As a result, a plurality of cavities H2 are left between the insulating films 11, and the insulating layer 13a is exposed to the cavities H2. For example, the sacrificial films 21 are removed by wet etching using hot phosphoric acid.

In some examples, insulating layer 13a may be formed by oxidizing the side face of the semiconductor layer 15b via the cavities H2 in place of formation in the process shown in FIG. 5A. In this case, the insulating layer 13a is formed, for example, by thermal oxidation in an atmosphere of a $H_2O$ gas at 950° C. and 9,000 Pa, or by radical oxidation in an atmosphere of $H_2$ and $O_2$ gases (or an atmosphere of a $H_2O$ gas) at 300° C. to 800° C. and 5 Pa to 250 Pa.

Subsequently, the side face of each of the semiconductor layers 15b is nitrided from each of the cavities H2 via the insulating layer 13a (FIG. 8A). As a result, the insulating layers 15a are formed on the side face of each of the semiconductor layers 15b on a side facing the insulating layer 13a. Thus, the charge storage film 15 including a plurality of the insulating layers 15a, a plurality of the semiconductor layers 15b, and the insulating layer 15c is formed. Each of the intermediate insulating films 14 is disposed between the insulating layers 15a adjacent to one another and between the semiconductor layers 15b adjacent to one another. For example, the insulating layers 15a are a SiN film. The insulating layers 15a are formed by thermal nitridation in an atmosphere of a NO or $N_2O$ gas at 800° C. to 950° C., and 9,000 Pa. The insulating layers 15a may be formed by radical nitridation in an atmosphere of a NO or $N_2O$ gas at 300° C. to 800° C. and 5 Pa to 250 Pa. In this case, the atmosphere may also contain He, Ne, Ar, Kr, Xe, or Rn gas.

FIG. 8A illustrates the columnar region 3 that is formed in the memory hole H1. The columnar region 3 includes the insulating layer 13a, the intermediate insulating films 14, the charge storage film 15, the tunnel insulating film 16, the channel semiconductor film 17, and the core insulating film 18 that are formed in this order on side faces of the insulating films 11.

Next, in each of the cavities H2, the insulating layer 13b, the barrier metal layer 12a, and the electrode material layer 12b are formed (FIG. 8B) via the previously formed slit. As a result, the block insulating film 13 and the electrode films 12 are formed on the side face of the charge storage film 15. Thus, the sacrificial films 21 are replaced by the electrode films 12. For example, the insulating layers 13b are an $AlO_x$ film having a thickness of about 3 nm. The insulating layers 13b are formed by ALD in a reduced pressure environment (2,000 Pa or less) at 200 to 500° C. using $AlCl_3$ and $O_3$ gases. For example, the barrier metal layers 12a are a TiN film. The barrier metal layers 12a are formed by CVD using $TiCl_4$ and $NH_3$ gases. For example, the electrode material layers 12b are a tungsten (W) layer. The electrode material layers 12b are formed by CVD using a $WF_6$ gas.

The insulating layers 13b may be formed by nitriding upper and lower faces of the insulating films 11. Thus, the aforementioned F-degassed barrier layer can be formed on an interface between the insulating layers 13b and the insulating films 11. The F-degassed barrier layer is formed, for example, by thermal nitridation in an atmosphere of a $NH_3$, NO, or $N_2O$ gas at 650° C. to 950° C. and 9,000 Pa, or by radical nitridation at 300° C. to 800° C. and 5 Pa to 250 Pa. In the latter case, the atmosphere may contain He, Ne, Ar, Kr, Xe, or Rn gas. Instead, the insulating layers 13b by themselves may be nitrided in a process shown in FIG. 8B. In this case, the insulating layers 13b are changed, for example, from the $AlO_x$ film to an aluminum nitride film (AlN film).

Subsequently, various insulating films, a wiring layer, a plug layer, and the like are formed on the substrate 1. For example, the insulating films fill the previously formed slit. Thus, the semiconductor storage device of the first embodiment is manufactured.

As described above, the charge storage film 15 of the embodiment is formed so as to include the insulating layers 15a (such as a SiN film), the semiconductor layers 15b (such as a polysilicon layer), and the insulating layer 15c (such as a SiN film). According to the first embodiment, the performance of the charge storage film 15 can be improved as described with reference to FIGS. 3A and 3B.

Second Embodiment

FIGS. 9A and 9B are cross-sectional views illustrating a structure of a semiconductor storage device of a second embodiment.

FIG. 9A illustrates a longitudinal cross section (XZ cross section) of the semiconductor storage device of the second embodiment. FIG. 9B illustrates a lateral cross section (XY cross section) of the semiconductor storage device of the second embodiment. FIG. 9B illustrates the lateral cross section taken along a line A-A' illustrated in FIG. 9A. FIG. 9A illustrates the longitudinal cross section taken along a line B-B' illustrated in FIG. 9B. The region illustrated in FIG. 9A corresponds to a part of the region illustrated in FIG. 9B. For example, the semiconductor storage device of the second embodiment is a three-dimensional semiconductor memory that is a different type from the semiconductor storage device of the first embodiment.

The semiconductor storage device of the second embodiment includes a substrate 31. As illustrated in FIG. 9A, a plurality of insulating films 32 and a plurality of electrode films 33 that are alternately stacked above the substrate 31. FIG. 9B illustrates two of the electrode films 33.

For example, the substrate 31 is a semiconductor substrate such as a silicon substrate. In FIGS. 9A and 9B, X and Y directions that are parallel to a surface of the substrate 31 and are perpendicular to each other, and a Z direction that is orthogonal to the surface of the substrate 31 are illustrated.

The insulating films 32 extend in the Y direction. For example, the insulating films 32 are a $SiO_2$ film. The electrode films 33 also extend in the Y direction. For example, the electrode films 33 include a TiN film as a barrier metal layer, and a tungsten (W) layer as an electrode material layer. The plurality of the electrode films 33 are separated from one another in the Z direction, and the insulating films 32 are positioned between the electrode films 33 (FIG. 9A). The side faces of the electrode films 33 are recessed relative to side faces of the insulating films 32 along the X direction (FIG. 9A). Therefore, recess portions that are each surrounded by upper and lower faces of each of the insulating films 32 and a side face of each of the electrode films 33 are formed.

As illustrated in FIG. 9A, the semiconductor storage device of the second embodiment further includes a block insulating film 34, a plurality of charge storage films 35, a plurality of tunnel insulating films 36, a channel semiconductor film 37, and a core insulating film 38 that are formed in this order on side faces of the insulating films 32 and the electrode films 33. In FIG. 9B, two block insulating films 34, two charge storage films 35, two tunnel insulating films 36, four channel semiconductor films 37, two core insulating films 38, and one insulating film 39 are illustrated.

The block insulating films 34 extend in the Y and Z directions. The block insulating films 34 each include an insulating layer 34a, a plurality of insulating layers 34b, a plurality of insulating layers 34c, and a plurality of insulating layers 34d. The insulating layer 34a is formed on upper, lower, and side faces of each of the insulating films 32 and a side face of each of the electrode films 33. A part of the insulating layer 34a is provided in each of the recess portions, and the rest of the insulating layer 34a is provided outside of the recess portions. On the other hand, the insulating layers 34b, the insulating layers 34c, and the insulating layers 34d in their entirety are provided inside the recess portions. The insulating layer 34b, the insulating layer 34c, and the insulating layer 34d in each of the recess portions are formed in this order on upper, lower, and side faces of the insulating layer 34a. In the second embodiment, when materials for the insulating layers 34a to 34d are varied, block insulating films 34 that have desired properties can be formed.

The charge storage films 35 and the tunnel insulating films 36 extend in the Y direction. Each of the charge storage films 35 includes a semiconductor layer 35a and an insulating layer 35b in each of the recess portions. The semiconductor layers 35a and the insulating layers 35b are formed on a side face of the block insulating film 34 in each of the recess portions. The tunnel insulating films 36 are each formed on a side face of a corresponding one of the charge storage films 35, and are in contact with the insulating layers 35b. For example, the tunnel insulating films 36 are a $SiO_2$ film.

The channel semiconductor films 37, the core insulating films 38, and the insulating film 39 extend in the Z direction. As illustrated in FIG. 9A, the channel semiconductor films 37 are formed on side faces of the block insulating films 34 and the tunnel insulating films 36. The core insulating films 38 are formed on side faces of the channel semiconductor films 37 (FIG. 9A), and extend in the Z direction through the stack of electrode films 32. As illustrated in FIG. 9B, an insulating film 39 is provided between the channel semiconductor films 37 adjacent to each other in the Y direction, and between the core insulating films 38 adjacent to each other in the Y direction. For example, the channel semiconductor films 37 are a polysilicon layer. For example, the core insulating films 38 are a $SiO_2$ film. For example, the insulating film 39 is a $SiO_2$ film.

As described above, in the semiconductor storage device of the second embodiment, the electrode films 33 extend in the Y direction, and the channel semiconductor films 37 extend in the Z direction. Therefore, the electrode films 33 are intersected by the channel semiconductor films 37 at predetermined Y and Z coordinates. A position where the electrode films 33 intersect with the channel semiconductor films 37 is called an "intersection". In the second embodiment, a region positioned on a side of the intersection is a cell unit, and a region shifted in the Y direction from the region positioned on the side of the intersection is an inter-cell unit.

Next, the charge storage films 35 of the embodiment will be further described with reference to FIGS. 9A and 9B.

For example, the semiconductor layers 35a are a polysilicon layer containing a carbon (C), nitrogen (N), or oxygen (O) impurities (dopants). In this case, the atomic concentration of the C, N, or O element in the semiconductor layers 35a is desirably $1.0 \times 10^{20}$ atoms/cm$^3$ or more. It is desirable that the semiconductor layers 35a in this case be a polysilicon layer containing crystal grains having a size (grain size) of 5 nm or less. For example, the average size of crystal grains in the semiconductor layers 35a is desirably 5 nm.

The semiconductor layers 35a may be an amorphous semiconductor layer such as an amorphous silicon layer instead of a polycrystal semiconductor layer. In this case, the amorphous silicon layer may contain a C, N, or O elements as described above. The charge storage films 35 may contain a conductor layer (e.g., a metal silicide layer) instead of the semiconductor layers 35a. In this case, the conductor layer may contain C, N, or O elements as described above.

For example, the insulating layers 35b comprise Si, C, and O or Si, N, and O. For example, the insulating layers 35b are a silicon oxide (SiO) or silicon oxynitride (SiNO) film. In some examples, the insulating layers 35b may be an insulator region that is so thin that it does not appear to be a complete film.

FIGS. 10A and 10B are cross-sectional views illustrating a structure of a semiconductor storage device of a second comparative example.

FIG. 10A illustrates a longitudinal cross section of the semiconductor storage device of this second comparative example. FIG. 10B illustrates an elongated longitudinal cross section of FIG. 10A. As illustrated in FIG. 10A, each charge storage film of this second comparative example includes only the semiconductor layer 35a. For example, the semiconductor layers 35a of this second comparative example are a polysilicon layer containing C, N, and O impurities. The semiconductor layers 35a of this second comparative example contain large crystal grains 41.

FIG. 10B illustrates more particularly the charge storage films 35, tunnel insulating films 36, and channel semiconductor films 37 of the semiconductor storage device of this second comparative example. For example, the tunnel insulating films 36 of this second comparative example are formed by oxidizing the side faces of the charge storage films 35. In this case, when the size of the crystal grains 41 in the semiconductor layers 35a is large, tunnel insulating films 36 that have a large surface roughness will be formed. As a result, an electric field will be concentrated on local portions (see a reference symbol R in FIG. 10B) of the tunnel insulating films 36 where the surface roughness is large, and leakage properties of memory cells will be deteriorated. Arrows illustrated in FIG. 10B schematically illustrate lines of electric force.

Figure 11B:
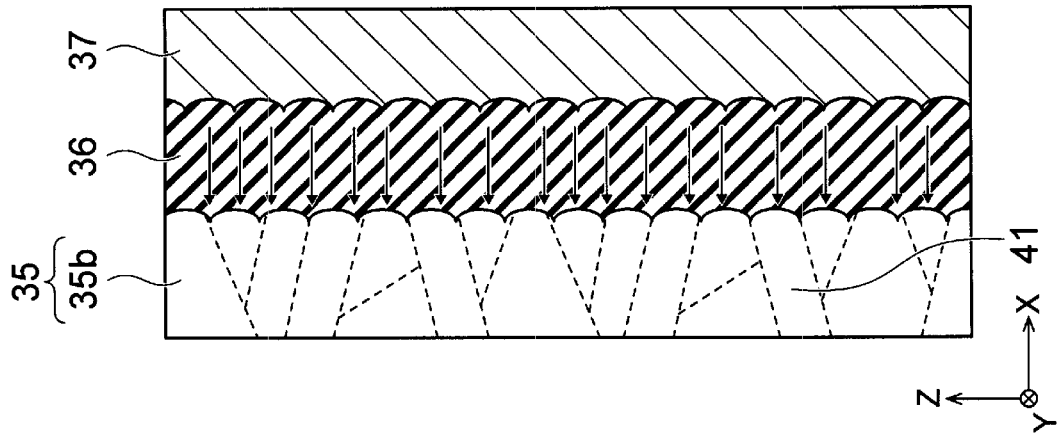
FIGS. 11A and 11B are cross-sectional views illustrating the structure of a semiconductor storage device according to a second embodiment.
Figure 11A:
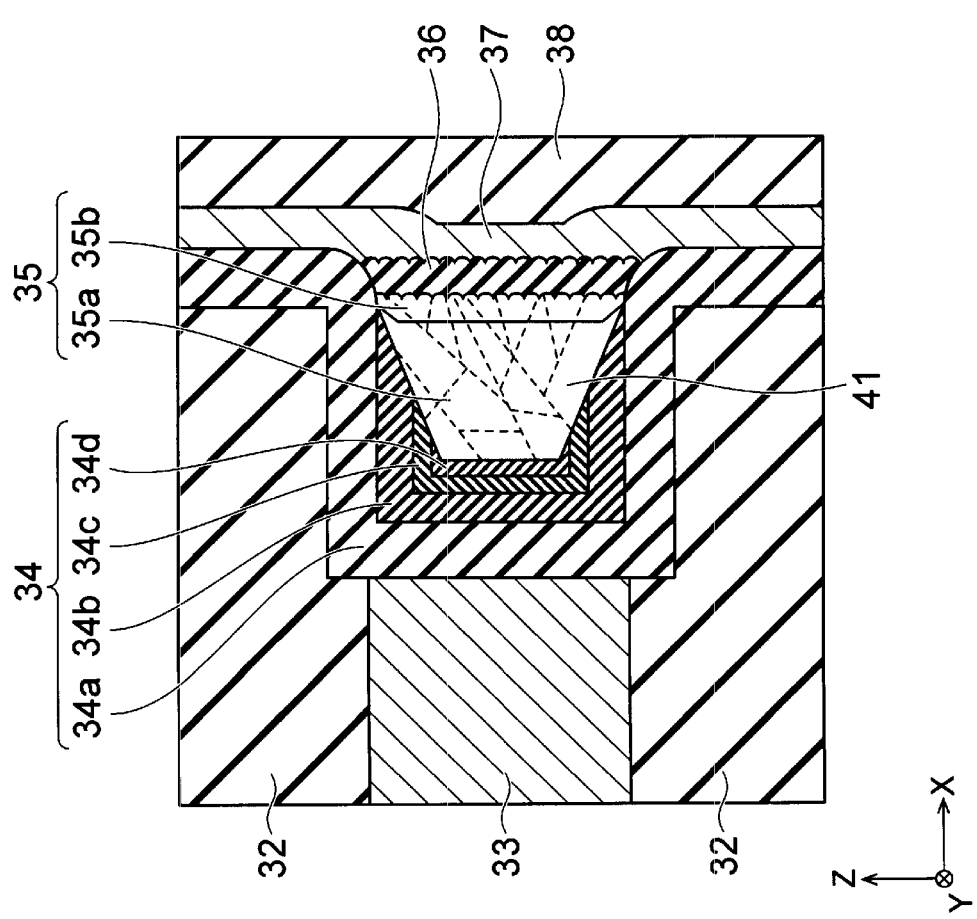

FIGS. 11A and 11B are cross-sectional view illustrating the structure of the semiconductor storage device of the second embodiment.

FIG. 11A illustrates a longitudinal cross section of the semiconductor storage device of the second embodiment. FIG. 11B illustrates an elongated longitudinal cross section of FIG. 11A. As illustrated in FIG. 11A, the charge storage films 35 of the second embodiment each include the semiconductor layer 35a and the insulating layer 35b. For example, the semiconductor layers 35a of the embodiment are a polysilicon layer containing C, N, or O. The semiconductor layers 35a of the second embodiment contain the crystal grains 41 that are small.

FIG. 11B illustrates the charge storage films 35, the tunnel insulating films 36, and the channel semiconductor films 37 of the semiconductor storage device of the second embodiment. For example, the tunnel insulating films 36 of the second embodiment are formed by oxidizing the side faces of the charge storage films 35. In this case, when the size of the crystal grains 41 in the semiconductor layers 35a is small, tunnel insulating films 36 that have a low surface roughness will be formed. Therefore, concentration of an electric field on specific portions of the tunnel insulating films 36 can be suppressed, and deterioration in leakage properties of memory cells can be suppressed. Arrows illustrated in FIG. 11B also schematically illustrate lines of electric force.

For example, the semiconductor layers 35a of the second embodiment are formed by forming an amorphous silicon layer containing C, N, or O and crystallizing this amorphous silicon layer. In this case, when the C, N, or O impurities are added at a high concentration into the amorphous silicon layer, a polysilicon layer containing the crystal grains 41 that are small can be formed. Thus, the tunnel insulating films 36 that have a low surface roughness can be formed. The atomic concentration of the C, N, or O in the semiconductor layers 35a is desirably $1.0 \times 10^{20}$ atoms/cm$^3$ or more. It is desirable that the semiconductor layers 35a be a polysilicon layer containing the crystal grains 41 that have a size of 5 nm or less.

In this context, the size of crystal grains is a particle diameter of the crystal grains, and for example, is calculated as follows. Cross section particle diameter analysis of the semiconductor layers 35a is performed by an automated crystal orientation mapping in a transmission electron microscope (ACOM-TEM). By this analysis, the area of cross section of each crystal grain in one cross section (for example, a TEM image) of the semiconductor layers 35a is calculated. Next, the diameter of a circle having the same area as the calculated area of each crystal grain in the cross-section is calculated. An average value of the diameters for the plurality of crystal grains contained in the one cross section of the semiconductor layers 35a is calculated. In the present description, this average value is used as the particle diameter of the crystal grains in the semiconductor layers 35a.

In the second embodiment, the semiconductor layers 35a that contain the carbon or nitrogen can be formed. When surfaces of the semiconductor layers 35a are doped with an O element, a silicon oxycarbide ("SiCO") or silicon oxynitride ("SiNO") film can be formed as the insulating layers 35b. According to the second embodiment, the insulating layers 35b (which are high dielectric constant layers) are formed between the semiconductor layers 35a and the tunnel insulating films 36. Thus, an electric field applied to the tunnel insulating films 36 can be mitigated. Accordingly, electrons are less likely to escape from the charge storage films 35, and charge holding properties and cycle properties of memory cells can be improved.

The semiconductor layers 35a of the second embodiment function as a floating gate layer, like the semiconductor layers 15b of the first embodiment. The configurations of the semiconductor layers 35a and the insulating layers 35b of the embodiment can be adapted to the charge storage film 15 of the first embodiment. That is, the first and second embodiment may be combined.

Figure 12B:
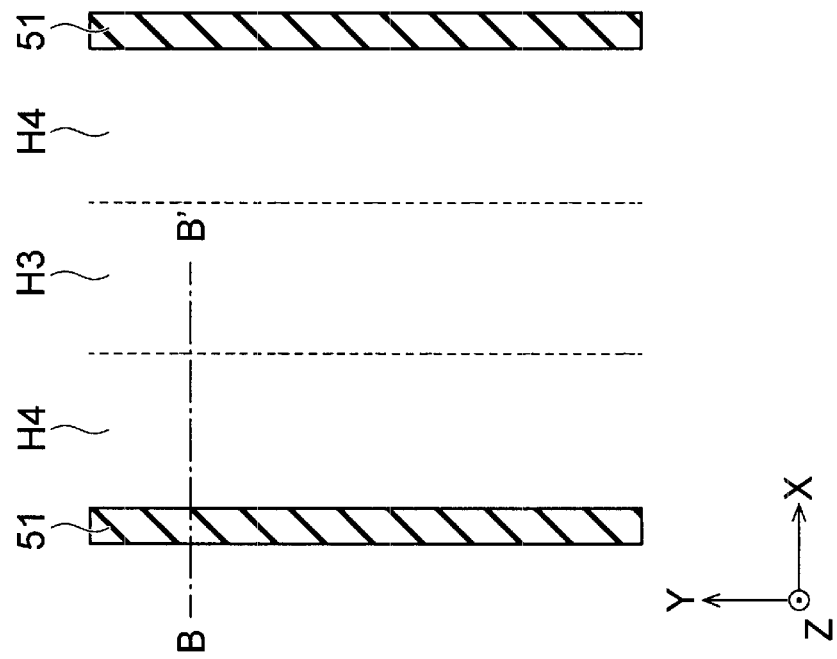
FIGS. 12A and 12B are cross-sectional views illustrating aspects of a method for manufacturing a semiconductor storage device according to a second embodiment.
Figure 12A:
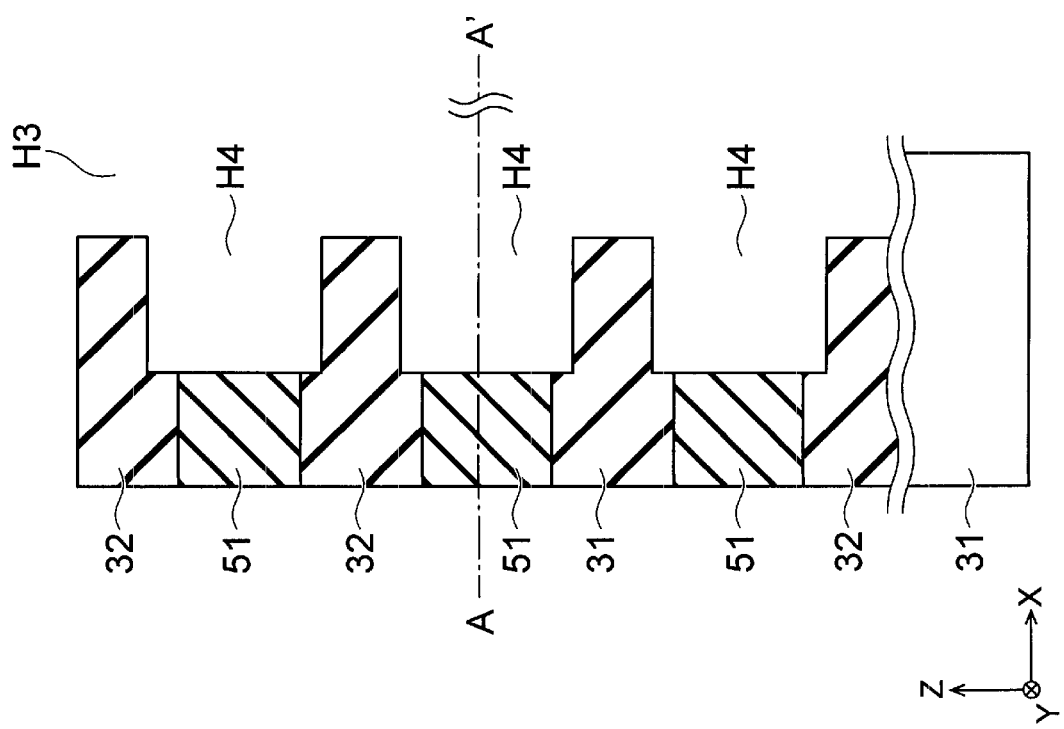

FIGS. 12A to 14B are cross-sectional views illustrating a method for manufacturing a semiconductor storage device of the second embodiment. FIGS. 12A and 12B illustrate a lateral cross section and a longitudinal cross section, respectively, of the semiconductor storage device of the second embodiment during manufacturing. This is also applicable to FIGS. 13A and 13B and FIGS. 14A and 14B.

Above the substrate 31, a plurality of the insulating films 32 and a plurality of sacrificial films 51 are alternately formed, and a memory hole H3 is formed in the insulating films 32 and the sacrificial films 51 by lithography and RIE (FIGS. 12A and 12B). For example, the insulating films 32 are a SiO$_2$ film having a thickness of about 50 nm. The insulating films 32 are formed by CVD in a reduced pressure environment (2,000 Pa or less) at 300° C. to 700° C. using TEOS. In positions of the sacrificial films 51, the electrode films 33 are ultimately formed in a process described below. For example, the sacrificial films 51 are a SiN film having a thickness of about 50 nm. The sacrificial films 51 are formed by CVD in a reduced pressure environment (2,000 Pa or less) at 300° C. to 850° C. using SiH$_2$Cl$_2$ and NH$_3$ gases. The memory hole H3 is processed into a shape extending in the Y and Z directions.

Subsequently, side faces of the sacrificial films 51 are selectively recessed from the side faces of the insulating films 32 (FIGS. 12A and 12B). As a result, a plurality of recess portions H4 are formed on the side faces of the sacrificial films 51. The side faces of the sacrificial films 51 are recessed, for example, by wet etching using hot phosphoric acid. For example, the dimension of each of the recess portions H4 in the X direction is about 20 nm. When the side faces of the sacrificial films 51 are recessed, the insulating films 32 are also partially etched.

Figure 13B:
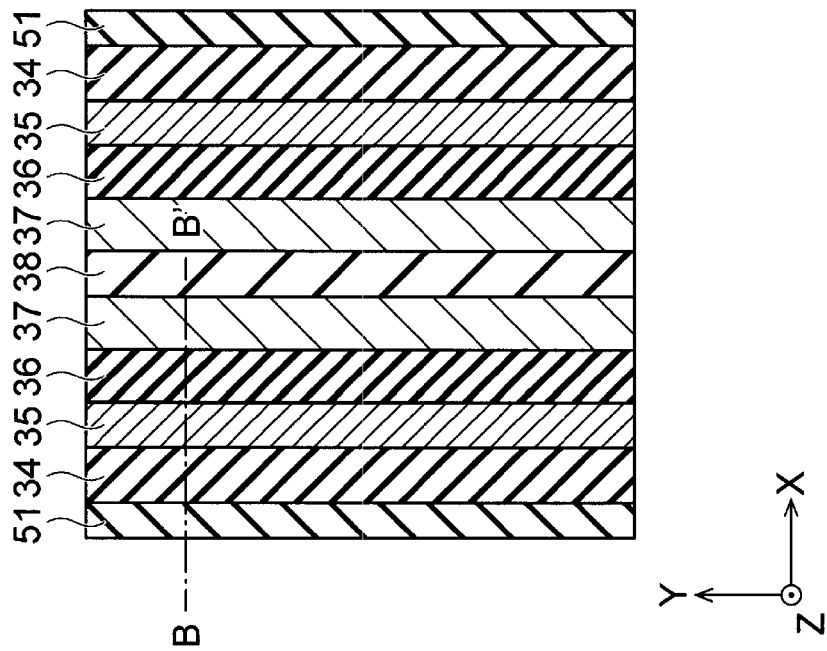
FIGS. 13A and 13B are cross-sectional views illustrating aspects of a method for manufacturing a semiconductor storage device according to a second embodiment.
Figure 13A:
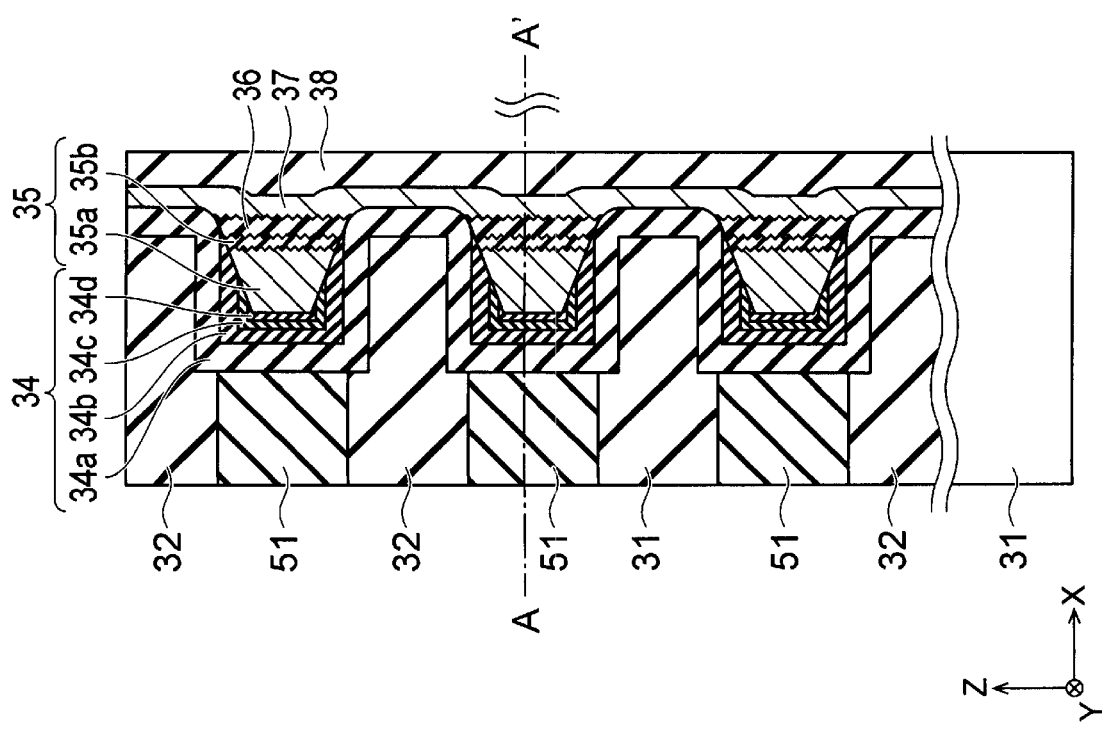

Next, the block insulating films 34, the charge storage films 35, the tunnel insulating films 36, the channel semiconductor films 37, and the core insulating films 38 are formed in this order inside the memory holes H3 and the recess portions H4 (FIGS. 13A and 13B). As a result, the block insulating films 34 are formed on the side faces of the insulating films 32 and the sacrificial films 51. The charge storage films 35 and the tunnel insulating films 36 are formed on the side faces of the block insulating films 34. The channel semiconductor films 37 and the core insulating films 38 are formed on the side faces of the block insulating films 34 and the tunnel insulating films 36.

For example, the block insulating films 34 may be or include a hafnium oxide film, a zirconium oxide film, or an aluminum oxide film, which is formed by CVD at 200° C. to 500° C. or lower. For example, the block insulating films 34 include a silicon oxide film and a silicon nitride film, which are formed at 200° C. to 800° C. or lower.

The semiconductor layer 35a in each of the charge storage films 35 is, for example, a polysilicon layer containing carbon. The semiconductor layers 35a are formed in a reduced pressure environment (2,000 Pa or less) at 300° C. to 700° C. using a gas containing silicon and a gas containing carbon. For example, the gas containing silicon is silane (SiH$_4$) gas, disilane (Si$_2$H$_6$) gas, dichlorosilane (SiH$_2$Cl$_2$) gas, trichlorosilane (SiHCl$_3$) gas, or an organic gas containing silicon. For example, the gas containing carbon is ethane (C$_2$H$_6$) or propane (C$_3$H$_8$) gas. In a process illustrated in FIGS. 13A and 13B, the semiconductor layers 35a are formed so that the atomic concentration of carbon in the semiconductor layers 35a is $1.0 \times 10^{20}$ atoms/cm$^3$ or more.

The semiconductor layers 35a of the embodiment can be formed as an amorphous silicon layer, and changed to a polysilicon layer by subsequent crystallization.

For example, the tunnel insulating films 36 are formed on the side faces of the semiconductor layers 35a by recessing the side faces of the semiconductor layers 35a using an aqueous hydrofluoric acid solution and an aqueous alkaline solution. For example, the tunnel insulating films 36 are a $SiO_2$ film. The tunnel insulating films 36 are formed by oxidizing the side faces of the semiconductor layers 35a by thermal oxidation, radical oxidation, or plasma oxidation. In the second embodiment, the semiconductor layers 35a are doped with oxygen under this oxidation process to form the insulating layers 35b between the semiconductor layers 35a and the tunnel insulating films 36. For example, the insulating layers 35b are a SiCO film. The semiconductor layers 35a of the second embodiment are crystallized by heat in this oxidation and are changed from the amorphous silicon layer to a polysilicon layer containing the crystal grains 41 that are small. In some examples, the semiconductor layers 35a of the second embodiment may not be crystallized by the heat of this oxidation but may be kept as an amorphous silicon layer.

For example, the channel semiconductor films 37 area silicon layer. The channel semiconductor films 37 are formed by CVD at 400° C. to 600° C. and 1 to 500 Pa using a $SiH_4$ gas, a $Si_2H_6$ gas, or an organic gas containing silicon, and then crystalized by annealing. As a result, this silicon layer is changed from an amorphous silicon layer to a polysilicon layer.

For example, the core insulating films 38 are a $SiO_2$ film. The core insulating films 38 are formed by CVD using TEOS.

Figure 14B:
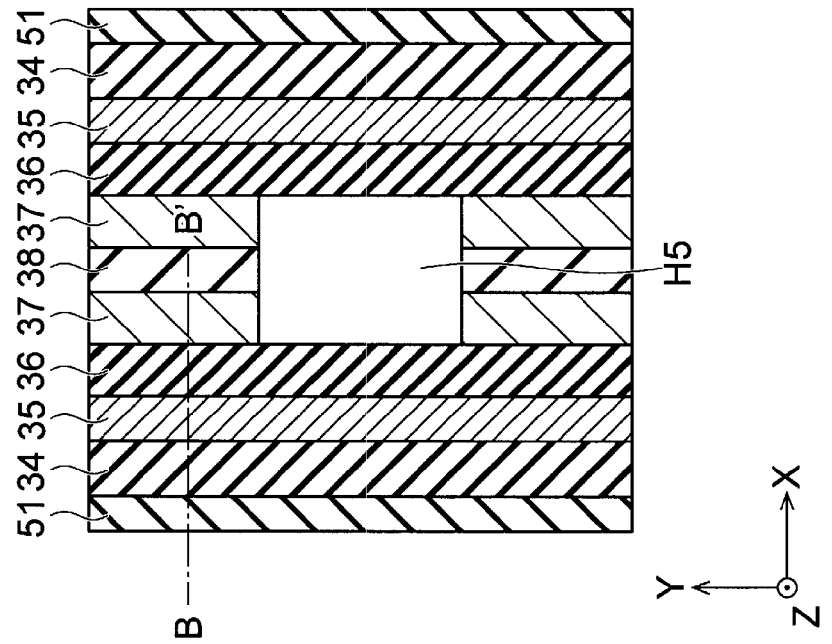
FIGS. 14A and 14B are cross-sectional views illustrating aspects of a method for manufacturing a semiconductor storage device according to a second embodiment.
Figure 14A:
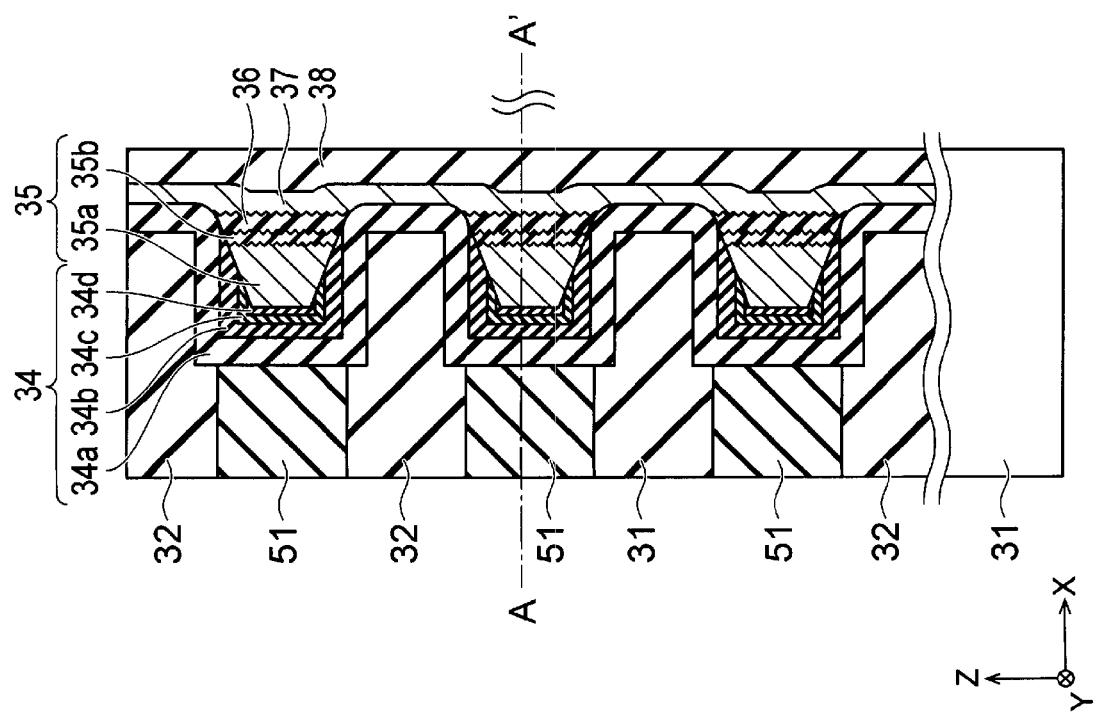

Subsequently, a hole H5 is formed in the channel semiconductor films 37 and the core insulating films 38 by lithography and RIE (FIG. 14B). As a result, the channel semiconductor films 37 and the core insulating films 38 are each divided into a plurality of portions, and are processed in a shape extending in the Z direction. The hole H5 is processed into a shape extending in the Z direction.

Subsequently, various insulating films, a wiring layer, a plug metal layer, and the like are formed on the substrate 31. For example, the hole H5 is filled with the insulating film 39, and the sacrificial films 51 are replaced by the electrode films 32 (FIGS. 9A and 9B). Thus, the semiconductor storage device of the second embodiment is manufactured.

As described above, the charge storage films 35 of the second embodiment are each formed so as to include a semiconductor layer 35a that contains carbon, nitrogen, or oxygen. According to the second embodiment, the performance (characteristics) of the charge storage films 35 and the tunnel insulating films 36 can be improved as described with reference to FIGS. 10A to 11B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
    a plurality of electrode films on a substrate, spaced from one another in a first direction orthogonal to a surface of the substrate;
    a first insulating film on end portions of the electrode films;
    a charge storage film facing, via the first insulating film, the end portions of the electrode films in a second direction parallel to the surface of the substrate;
    a second insulating film on the charge storage film, the charge storage film being between the first and second insulating films in the second direction;
    a semiconductor film on the second insulating film, the second insulating film being between the charge storage film and the semiconductor film in the second direction; and
    a plurality of third insulating films between adjacent first regions in the first direction and between adjacent second regions in the first direction, wherein
    the charge storage film comprises a plurality of first regions that are spaced from each other in the first direction and an insulator material contacting the first insulating film, a plurality of second regions that are spaced from each other in the first direction and a semiconductive or conductive material directly adjacent to the first regions in the second direction, and a third region that is an insulator material adjacent to the second insulating film in the second direction, and
    the third region extends continuously in the first direction and is in contact with the plurality of third insulating films in the second direction.

2. The semiconductor storage device according to claim 1, wherein the second regions do not directly contact the first and second insulating films.

3. The semiconductor storage device according to claim 1, wherein the second regions contain boron or phosphorus.

4. The semiconductor storage device according to claim 3, wherein
    the second regions are polysilicon, and
    an atomic concentration of boron or phosphorus in the second regions is $1.0 \times 10^{19}$ atoms/$cm^3$ to $5.0 \times 10^{20}$ atoms/$cm^3$.

5. The semiconductor storage device according to claim 1, wherein the third region comprises silicon and nitrogen.

6. The semiconductor storage device according to claim 5, wherein a composition ratio of nitrogen atoms to silicon atoms in the third region is at least 1.22.

7. The semiconductor storage device according to claim 1, wherein
    a thickness along the second direction of the third region in a portion between one of the third insulating films and the second insulating film is less than a thickness along the second direction of the third region in a portion between one of the second regions and the second insulating film.

8. The semiconductor storage device according to claim 7, wherein the third insulating films have a dielectric constant that is lower than a dielectric constant of either one of third region or the first regions.

9. The semiconductor storage device according to claim 1, wherein the second regions are polysilicon.

10. The semiconductor storage device according to claim 1, wherein the second regions are metal.

11. The semiconductor storage device according to claim 1, wherein the first regions comprise silicon and nitrogen.

12. The semiconductor storage device according to claim 11, wherein a composition ratio of nitrogen atoms to silicon atoms in the first regions is at least 1.22.

13. A semiconductor storage device, comprising:
a plurality of electrode films on a substrate, spaced from one another in a first direction orthogonal to a surface of the substrate;
a first insulating film on end portions of the electrode films
a charge storage film facing, via the first insulating film, the end portions of the electrode films in a second direction parallel to the surface of the substrate;
a second insulating film on the charge storage film, the charge storage film being between the first and second insulating films in the second direction; and
a semiconductor film on the second insulating film, the second insulating film being between the charge storage film and the semiconductor film in the second direction, wherein
the charge storage film includes a first region of semiconductive or conductive material including carbon, nitrogen, or oxygen dopants,
the first region is a polycrystalline semiconductor material with crystal grains with an average size of 5 nm or less,
the second insulating film is divided in a third direction crossing the second direction, and
the semiconductor film is divided in the third direction.

14. The semiconductor storage device according to claim 13, wherein an atomic concentration of carbon, nitrogen, or oxygen in the first region is at least $1.0 \times 10^{20}$ atoms/cm$^3$.

15. The semiconductor storage device according to claim 13, wherein the charge storage film further includes a second region of an insulating material, the second region being in direct contact with the second insulating film.

16. The semiconductor storage device according to claim 15, wherein the second region is a silicon oxycarbide.

17. The semiconductor storage device according to claim 15, wherein the second region is a silicon oxynitride.

18. The semiconductor storage device according to claim 13, wherein
the electrode films extend in the second direction parallel to the surface of the substrate, and
the semiconductor film extends in the first direction.

19. The semiconductor storage device according to claim 13, wherein the charge storage film and the second insulating film extend as lines in the third direction.

20. A semiconductor storage device, comprising:
a plurality of electrode films on a substrate, spaced from one another in a first direction orthogonal to a surface of the substrate;
a first insulating film on end portions of the electrode films;
a charge storage film facing, via the first insulating film, the end portions of the electrode films in a second direction parallel to the surface of the substrate;
a second insulating film on the charge storage film, the charge storage film being between the first and second insulating films in the second direction;
a semiconductor film on the second insulating film, the second insulating film being between the charge storage film and the semiconductor film in the second direction; and
a plurality of third insulating films between adjacent first regions in the first direction and between adjacent second regions in the first direction, wherein
the charge storage film comprises a plurality of first regions that are spaced from each other in the first direction and an insulator material contacting the first insulating film, a plurality of second regions that are spaced from each other in the first direction and a semiconductive or conductive material directly adjacent to the first regions in the second direction, and a third region that is an insulator material adjacent to the second insulating film in the second direction, and
a thickness along the second direction of the third region in a portion between one of the third insulating films and the second insulating film is less than a thickness along the second direction of the third region in a portion between one of the second regions and the second insulating film.

21. The semiconductor storage device according to claim 20, wherein the third insulating films have a dielectric constant that is lower than a dielectric constant of either one of third region or the first regions.

* * * * *